(12) United States Patent
Shizuno

(10) Patent No.: US 7,323,778 B2
(45) Date of Patent: Jan. 29, 2008

(54) SEMICONDUCTOR DEVICE WITH IMPROVED DESIGN FREEDOM OF EXTERNAL TERMINAL

(75) Inventor: Yoshinori Shizuno, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 174 days.

(21) Appl. No.: 10/697,311

(22) Filed: Oct. 31, 2003

(65) Prior Publication Data

US 2005/0230794 A1 Oct. 20, 2005

(30) Foreign Application Priority Data

Nov. 8, 2002 (JP) ............................. 2002-325773

(51) Int. Cl.
*H01L 23/02* (2006.01)
(52) U.S. Cl. ................... 257/735; 257/693; 257/737; 257/738; 257/E23.069
(58) Field of Classification Search ............... 257/735, 257/693, 737, 738, E23.069
See application file for complete search history.

(56) References Cited

U.S. PATENT DOCUMENTS

| | | | | |
|---|---|---|---|---|
| 5,342,495 | A * | 8/1994 | Tung et al. ............ | 204/297.03 |
| 5,444,303 | A * | 8/1995 | Greenwood et al. ........ | 257/786 |
| 5,898,213 | A * | 4/1999 | Torres et al. ............... | 257/666 |
| 6,268,648 | B1 | 7/2001 | Fukutomi et al. | |
| 6,271,469 | B1 | 8/2001 | Ma et al. | |
| 6,271,588 | B1 * | 8/2001 | Ohuchi ........................ | 257/734 |
| 6,300,685 | B1 * | 10/2001 | Hasegawa et al. ........... | 257/780 |
| 6,433,409 | B2 * | 8/2002 | Mita et al. ................... | 257/673 |
| 6,455,920 | B2 | 9/2002 | Fukasawa et al. | |
| 6,472,749 | B1 * | 10/2002 | Hirano et al. ............... | 257/737 |
| 6,552,430 | B1 * | 4/2003 | Perez et al. ................. | 257/738 |
| 6,762,075 | B2 | 7/2004 | Kishimoto et al. | |
| 6,800,930 | B2 * | 10/2004 | Jackson et al. ............. | 257/700 |
| 6,861,284 | B2 | 3/2005 | Higashi et al. | |
| 6,870,276 | B1 * | 3/2005 | Moxham et al. ............. | 257/784 |
| 2002/0014683 | A1 * | 2/2002 | Ichinose .................... | 257/666 |
| 2002/0192867 | A1 | 12/2002 | Nishiyama | |
| 2003/0042588 | A1 * | 3/2003 | Ushijima et al. ........... | 257/684 |
| 2004/0004284 | A1 * | 1/2004 | Lee et al. .................... | 257/737 |

FOREIGN PATENT DOCUMENTS

| | | |
|---|---|---|
| JP | 61-075488 | 4/1986 |
| JP | 10-178044 | 6/1998 |
| JP | 11-251493 | 9/1999 |
| JP | 2000124354 | 4/2000 |
| JP | 2000208556 A | 7/2000 |
| JP | 2000-277682 | 10/2000 |
| JP | 2001-177045 | 6/2001 |
| JP | 2001308116 A | 11/2001 |
| JP | 2002-016173 | 1/2002 |
| JP | 2002-016179 A | 1/2002 |
| JP | 2002-093830 | 3/2002 |
| JP | 2002-164385 A | 6/2002 |
| JP | 2002-231854 | 8/2002 |
| JP | 2002-314028 A | 10/2002 |
| JP | 2002-343927 | 11/2002 |

\* cited by examiner

*Primary Examiner*—Eugene Lee
(74) *Attorney, Agent, or Firm*—Rabin & Berdo, PC

(57) ABSTRACT

A semiconductor device comprises: a semiconductor chip; an extension portion formed in contact with the side surfaces so as to surround the semiconductor chip; an insulating film formed on a surface of the extension portion and the semiconductor chip; each of a plurality of wiring patterns electrically connected to each electrode pad, respectively and extended from the electrode pads to the surface of the extension portion; a sealing portion formed such that a part of each of the wiring patterns is exposed; and a plurality of external terminals provided over the wiring patterns in a region including the upper side of the extension portion.

19 Claims, 17 Drawing Sheets

SEMICONDUCTOR DEVICE WITH IMPROVED DESIGN FREEDOM OF EXTERNAL TERMINAL

BACKGROUND OF THE INVENTION

1. Field of the Invention

This invention relates to a semiconductor device, and more particularly to a semiconductor device in which the degree of design freedom of an external terminal is increased in accordance with further increases in the number of external terminals.

2. Description of Related Art

Demands have been made in recent years for further reductions in the size and thickness of packaged semiconductor devices. In response to such demands, a packaging form known as a Wafer Level Chip Size Package (to be referred to simply as WCSP hereinafter), in which the external size of the packaging is substantially equal to the external size of the semiconductor chip, has been proposed.

A WCSP comprises a semiconductor chip. The semiconductor chip comprises a circuit element having a predetermined function and a plurality of electrode pads electrically connected to each other on the circuit element. An insulating film is formed on the surface of the semiconductor chip such that the plurality of electrode pads is exposed.

A plurality of wiring patterns connected to the exposed electrode pads is formed on the surface of the insulating film.

Electrode posts are formed on these wiring patterns. A sealing portion is then formed so as to cover the insulating film and wiring patterns and such that the top surface of the electrode posts is exposed.

A plurality of external terminals provided as solder balls used in BGA packaging, for example, is provided on the top surface of the electrode posts.

This type of WCSP has a so-called fan-in configuration in which the multiple external terminals are provided in a lattice formation, for example, in a region corresponding to a circuit-forming surface of the semiconductor chip.

As regards the mounting of the semiconductor chip comprising the external terminals in a fan-in configuration onto a printed board, Japanese Patent Application Laid-Open Publication No. 2000-208556 discloses a semiconductor device having the aim of preventing the breakage of a connecting portion between the printed board and external electrodes and comprising a semiconductor chip having electrode pads, wiring which is formed in a predetermined position on the semiconductor chip and connected to the electrode pads, external electrodes which are formed in a predetermined position on the wiring and connected to the wiring, a printed board connected to the external electrodes, and a substrate which is formed on the semiconductor chip. A resin layer is provided on the substrate for aligning the thermal expansion of the substrate and printed board, and in particular the external electrodes are provided on the resin layer.

As semiconductor devices become increasingly sophisticated, the number of external terminals formed on a single packaged semiconductor device is gradually increasing. Conventionally, such demands for increases in the number of external terminals have been met by providing constitutions in which the spacing between adjacent external terminals is narrowed. As shall be described below, however, design freedom is severely restricted by the disposal pitch and disposal positions of external terminals.

In the conventional WCSP described above, the minimum gap between adjacent external terminals is set at a concrete level of approximately 0.5 mm. In the case of a 7 mm×7 mm WCSP, the number of external terminals provided is approximately 160.

In accordance with demands for further increases in the number of external terminals on a packaged semiconductor device, it is desirable that approximately 300 external terminals be provided on a 7 mm×7 mm WCSP.

It is not technically impossible in the aforementioned WCSP to form an even larger number of external terminals on the surface of the WCSP by further narrowing the gap between adjacent external terminals.

However, it is extremely difficult to form 300 external terminals on the surface area of a 7 mm×7 mm WCSP. Moreover, if the intervals between the external terminals are narrowed, an extremely high degree of technology is required to mount the WCSP onto a mounting substrate.

For example, the intervals between the plurality of external terminals may have to be formed in alignment with the mounting pitch of the mounting substrate within a range of approximately 0.3 mm to 0.7 mm.

In a conventional packaging constitution in such a case, a semiconductor chip is connected to the substrate by means of a so-called flip chip connection and the semiconductor chip is connected to the external electrodes via the substrate. Alternatively, the substrate and semiconductor chip are connected by wire bonding and the semiconductor chip is connected to the external electrode via the substrate. Since both of these connection methods utilize a substrate, and since additional sealing material is required in accordance with the height of the wire loop, the package becomes thick. Moreover, the package becomes expensive due to the cost of the substrate. The package becomes particularly expensive when a flip chip connection is used since an expensive buildup substrate is required.

When connection is performed by means of wire bonding, the inductance of the wire part increases. An object of this invention is therefore to provide a semiconductor device having a constitution in which design freedom in the disposal pitch and disposal positions of external terminals is increased and the package itself can be made compact.

SUMMARY OF THE INVENTION

In order to achieve this object, a semiconductor device of this invention has the following constitution. That is, the semiconductor device of this invention comprises a semiconductor chip having a first main surface on which a plurality of electrode pads is provided, a second main surface which opposes the first main surface, and a plurality of side surfaces positioned between the first main surface and second main surface.

An extension portion is formed in contact with the side surfaces of the semiconductor chip so as to surround the semiconductor chip.

An insulating film is formed on the surface of the extension portion and the first main surface such that a part of each of the electrode pads is exposed.

A plurality of wiring patterns is formed on the insulating film so as to be electrically connected to the electrode pads, respectively, and extended from the electrode pads to the surface of the extension portion.

A sealing portion is formed on the wiring patterns and insulating film such that a part of each of the wiring patterns is exposed.

A plurality of external terminals is provided over the wiring patterns in a region including the upper side of the extension portion.

According to the constitution of the semiconductor device of this invention, external terminals can also be provided in a region including the extension portion which is provided in contact with the semiconductor chip so as to surround the semiconductor chip, and thus a semiconductor device having a greater degree of design freedom regarding the disposal pitch, disposal positions, and so on of the external terminals can be provided. Moreover, by applying a so-called WCSP manufacturing process, the semiconductor device of this invention can be constituted without the use of an interposer such as a substrate. As a result, improvements in operational speed, functional sophistication, number of functions, and compactness can be achieved in comparison with a device in which a wire bonding connection is employed. Further, an equal electrical characteristic can be achieved at a lower cost than a device in which a flip-chip connection is employed.

Upon the implementation of this invention, a manufacturing method for a semiconductor device preferably comprises the following manufacturing processes.

A manufacturing method for a semiconductor device comprises:

(1) setting a plurality of semiconductor chip disposal regions, on which a plurality of semiconductor chips is to be disposed, at a predetermined pitch on a lower base;

(2) providing a semiconductor chip comprising a first main surface on which a plurality of electrode pads is provided, a second main surface which opposes the first main surface, and a plurality of side surfaces between the first main surface and second main surface on the semiconductor chip disposal region such that the first main surface faces the semiconductor chip disposal region;

(3) forming an extension portion on the lower base so as to cover the second main surface and side surfaces of the semiconductor chip;

(4) removing the lower base from a first surface of the extension portion and the first main surface of the semiconductor chip;

(5) forming an insulating film on the first surface and first main surface such that a part of each of the electrode pads is exposed;

(6) forming a plurality of wiring patterns on the surface of the insulating film so as to be electrically connected to the electrode pads, respectively and extended from the electrode pads to the upper side of the first surface of the extension portion;

(7) forming a sealing portion on the insulating film on which the wiring patterns are formed such that a part of each of the wiring patterns which is positioned on the upper side of the first surface is exposed;

(8) forming a plurality of external terminals over the wiring patterns in a region including the upper side of the extension portion and connecting the external terminals to the wiring patterns; and (9) severing the plurality of semiconductor chips to form individual semiconductor devices comprising a semiconductor chip.

Further, a manufacturing method for a semiconductor device comprises:

(1) setting a plurality of semiconductor chip disposal regions, on which a plurality of semiconductor chips is to be disposed, at a predetermined pitch on a lower base;

(2) providing a semiconductor chip comprising a first main surface on which a plurality of electrode pads is provided, a second main surface which opposes the first main surface, and a plurality of side surfaces between the first main surface and second main surface on the semiconductor chip disposal region such that the first main surface faces the semiconductor chip disposal region;

(3) forming an extension portion on the lower base so as to cover the second main surface and side surfaces of the semiconductor chip;

(4) removing the lower base from a first surface of the extension portion and the first main surface of the semiconductor chip;

(5) forming an insulating film on the first surface and first main surface such that a part of each of the electrode pads is exposed;

(6) forming a plurality of wiring patterns on the surface of the insulating film so as to be electrically connected to the electrode pads, respectively and extended from the electrode pads to the upper side of the first surface of the extension portion;

(7) forming a plurality of electrode posts on each of the part of the wiring patterns positioned on the upper side of the extension portion;

(8) forming a sealing portion on the insulating film on which the wiring patterns and electrode posts are formed such that the top surface of the electrode posts is exposed;

(9) forming external terminals on the top surface of the exposed electrode posts; and

(10) severing the plurality of semiconductor chips to form individual semiconductor devices comprising a semiconductor chip.

Further, a manufacturing method for a semiconductor device comprises:

(1) setting a plurality of semiconductor chip disposal regions on which a plurality of semiconductor chips is to be disposed and a plurality of passive element disposal regions on which a plurality of passive elements is to be disposed at a predetermined pitch on a lower base;

(2) providing a semiconductor chip comprising a first main surface on which a plurality of electrode pads is provided, a second main surface which opposes the first main surface, and a plurality of side surfaces between the first main surface and second main surface on the semiconductor chip disposal region such that the first main surface faces the semiconductor chip disposal region;

(3) providing a passive element comprising connection terminals on the passive element disposal region such that the connection terminals face the passive element disposal region on the lower base;

(4) forming an extension portion on the lower base so as to cover the second main surface and side surfaces of the semiconductor chip and the passive element;

(5) removing the lower base from a first surface of the extension portion and the first main surface of the semiconductor chip;

(6) forming an insulating film on the first surface and first main surface such that a part of each of the electrode pads and a part of the connection terminals are exposed;

(7) forming a plurality of wiring patterns having wiring patterns which are electrically connected to the electrode pads respectively and extended from the electrode pads to the upper side of the first surface of the extension portion and wiring patterns which are electrically connected to the connection terminals on the surface of the insulating film;

(8) forming a sealing portion on the insulating film on which the wiring patterns are formed such that a part of each of the wiring patterns which is positioned on the upper side of the first surface is exposed;

(9) forming a plurality of external terminals on the wiring patterns in a region including the upper side of the extension portion and connecting the external terminals to the wiring patterns; and

(10) severing the plurality of semiconductor chips to form individual semiconductor devices comprising a semiconductor chip.

Further, a manufacturing method for a semiconductor device comprises:

(1) setting a plurality of semiconductor chip disposal regions on which a plurality of semiconductor chips is to be disposed and a plurality of passive element disposal regions on which a plurality of passive elements is to be disposed at a predetermined pitch on a lower base;

(2) providing a semiconductor chip comprising a first main surface on which a plurality of electrode pads is provided, a second main surface which opposes the first main surface, and a plurality of side surfaces between the first main surface and second main surface on the semiconductor chip disposal region such that the first main surface faces the semiconductor chip disposal region;

(3) providing a passive element comprising connection terminals on the passive element disposal region such that the connection terminals face the passive element disposal region on the lower base;

(4) forming an extension portion on the lower base so as to cover the second main surface and side surfaces of the semiconductor chip and the passive element;

(5) removing the lower base from a first surface of the extension portion and the first main surface of the semiconductor chip;

(6) forming an insulating film on the first surface and first main surface such that a part of each of the electrode pads and a part of the connection terminals are exposed;

(7) forming a plurality of wiring patterns comprising wiring patterns which are electrically connected to the electrode pads, respectively and extended from the electrode pads to the upper side of the first surface of the extension portion and wiring patterns which are electrically connected to the connection terminals on the surface of the insulating film;

(8) forming a plurality of electrode posts on the exposed part of the wiring patterns positioned on the upper side of the extension portion;

(9) forming a sealing portion on the insulating film on which the wiring patterns and electrode posts are formed such that the top surface of the electrode posts is exposed;

(10) forming external terminals on the top surface of the exposed electrode posts; and

(11) severing the plurality of semiconductor chips to form individual semiconductor devices comprising a semiconductor chip.

According to this manufacturing method for the semiconductor device of this invention, a semiconductor device can be provided by means of a simple process and with a greater functional sophistication, number of functions, and compactness. In particular, design freedom in the disposal pitch, disposal positions, and so on of the external terminals can be greatly increased.

BRIEF DESCRIPTION OF THE DRAWINGS

The foregoings and other objects, features and advantageous of the present invention will be better understood from the following description taken in connection with the accompanying drawings, in which:

FIG. 1(B) is a plan view showing an expanded outline of the main parts of a region of FIG. 1(A) in order to illustrate the connection relationship between a wiring pattern and electrode pads. while

DESCRIPTION OF THE PREFERRED EMBODIMENTS

Figure 1A:
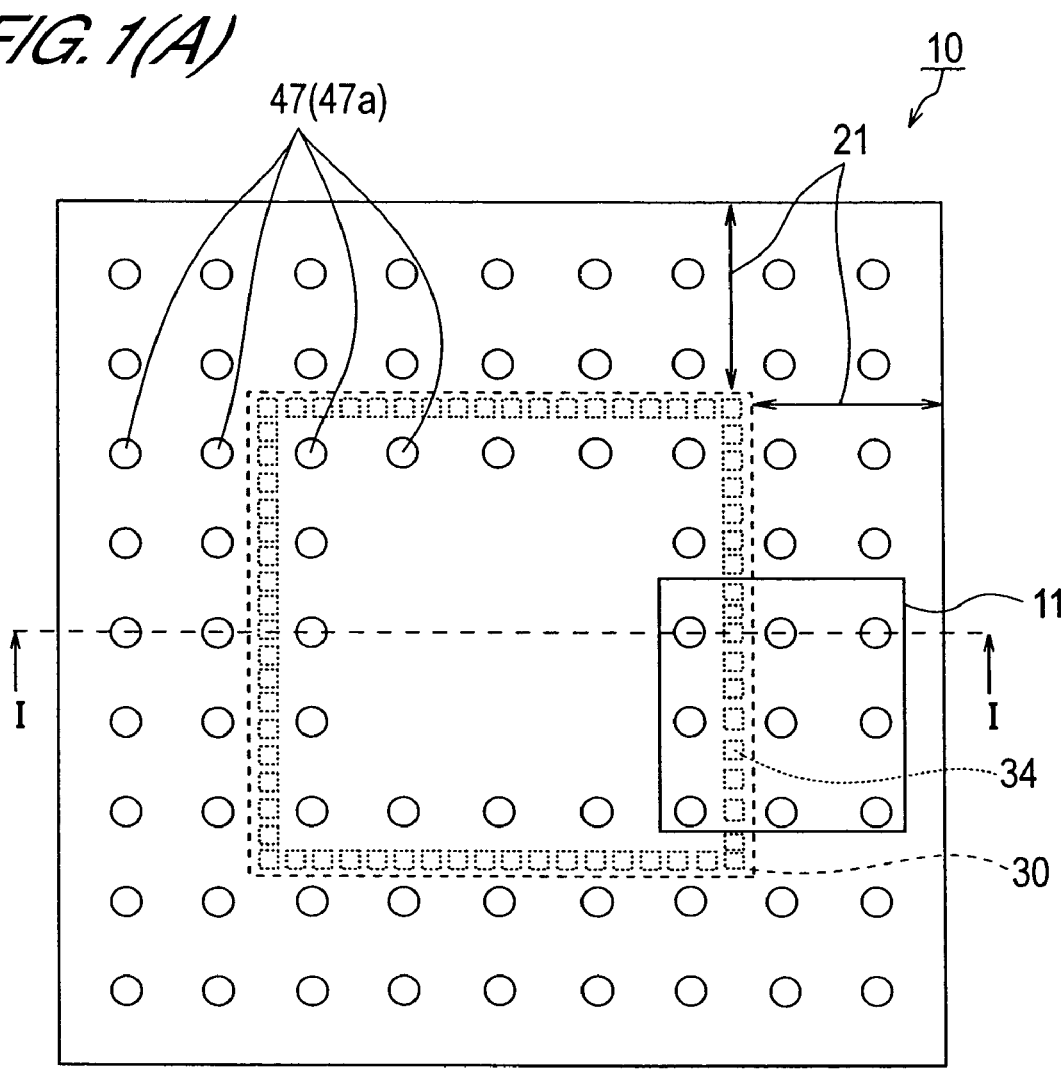
FIG. 1(A) is a plan view seen from above showing in outline the constitution of a semiconductor device according to a first embodiment of this invention.

Embodiments of this invention will be described below with reference to the drawings. Note that in the drawings, the form, magnitude, and positional relationships of each constitutional component are merely illustrated schematically in order to facilitate understanding of this invention and no particular limitations are placed on this invention thereby. Further, although specific materials, conditions, numerical value conditions, and soon are used in the following description, these are merely one preferred example thereof and therefore do not place any limitations on this invention. It is to be understood that similar constitutional components in the drawings used in the following description are allocated and illustrated with identical reference symbols, and that duplicate description thereof has occasionally been omitted.

First Embodiment

Figure 1B:
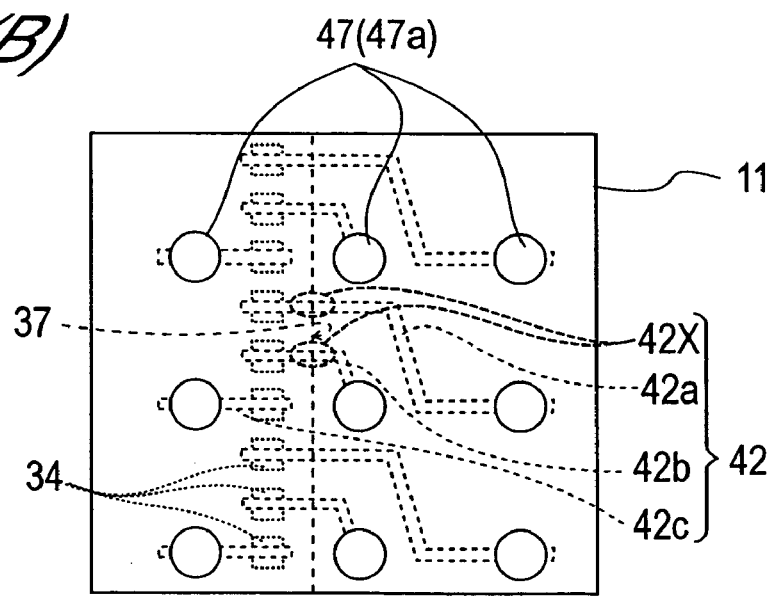
Figure 1C:
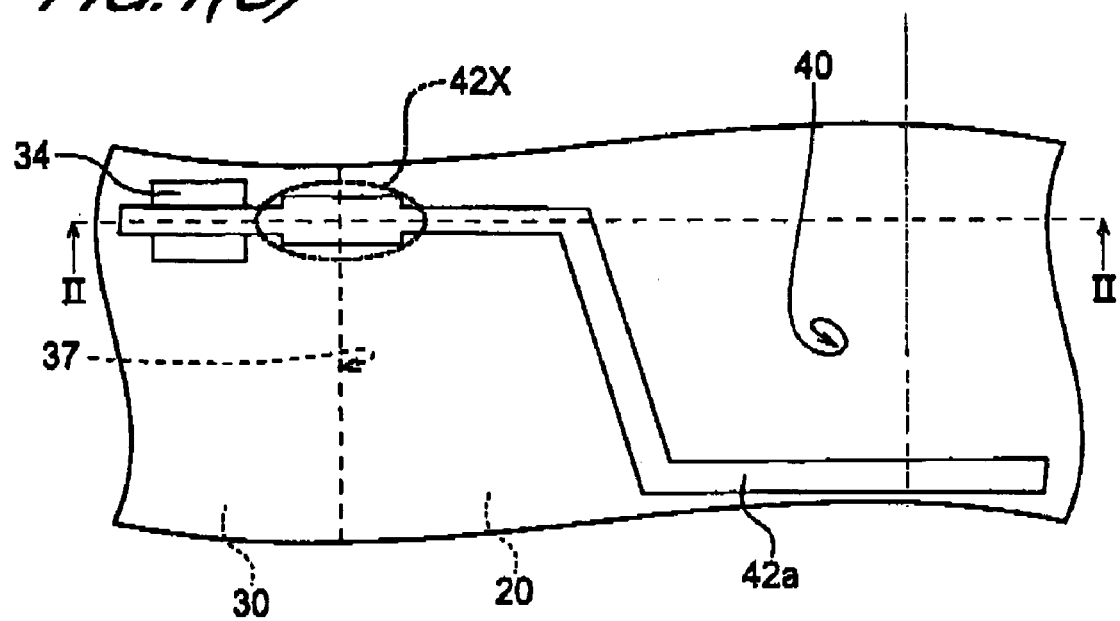
FIG. 1(C) is a more detailed Nan view according to FIG. 1(B).
Figure 1D:
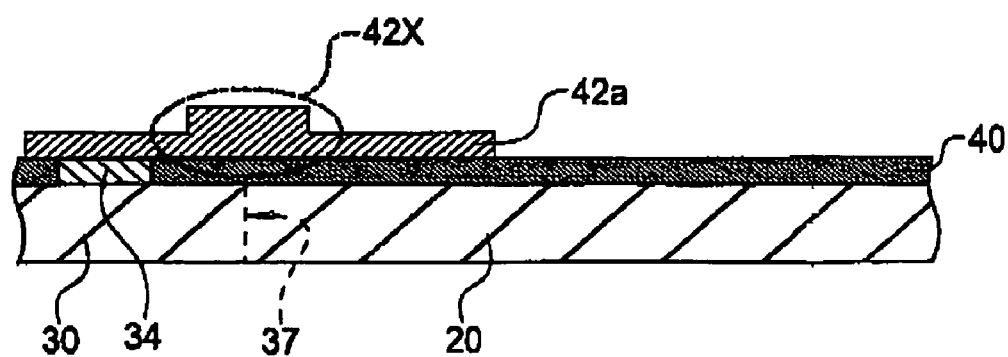
FIG. 1(D) is a more detailed plan view according to FIG. 1(A). but is a cross-sectional view taken along line II—II of FIG. 1(C)
Figure 2A:
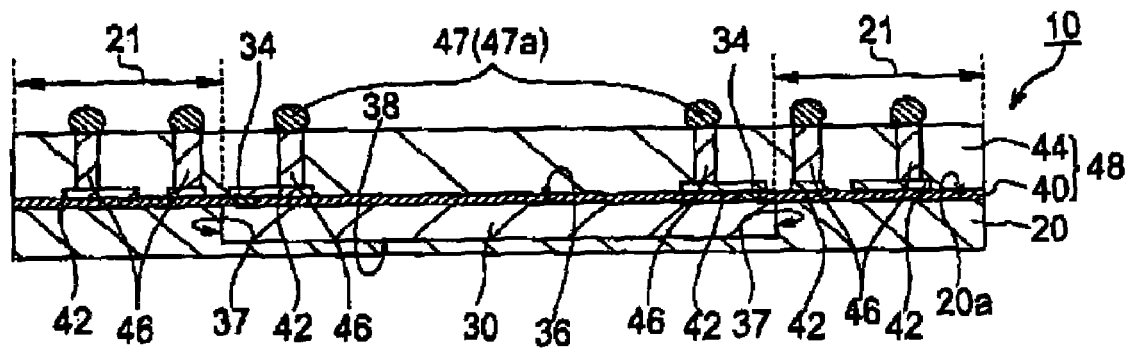
FIG. 2(A) is a schematic sectional view showing a cross section of the semiconductor device according to the first embodiment severed along a broken line I—I in FIG. 1(A), and FIG, 2(B) is a more detailed schematic view according to FIG. 2(B)

A semiconductor device according to a first embodiment of this invention will now be described with reference to FIGS. 1 and 2. FIG. 1(A) is a plan view seen from above showing in outline the constitution of the semiconductor device of the first embodiment, and FIG. 1(B) is a plan view showing an expanded outline of the main parts of a partial region of FIG. 1(A) in order to illustrate the connection relationship between a wiring pattern and electrode pads. FIG. 2(A) is a schematic sectional view showing a cross section severed along a broken line I—I in FIG. 1(A).

A semiconductor device 10 of the first embodiment of this invention comprises a semiconductor chip 30.

A circuit element (not shown) having a predetermined function is formed on the semiconductor chip 30. The semiconductor chip 30 comprises a first main surface 36 on which a plurality of electrode pads 34 which are electrically connected to the circuit element is provided and a second main surface 38 which opposes the first main surface 36. A plurality of side surfaces 37 exists between the first main surface 36 and second main surface 38. The plurality of electrode pads 34 is formed around the peripheral edge of the first main surface 36.

The semiconductor device 10 of this invention also comprises an extension portion 20. The extension portion 20 is provided in contact with the side surfaces 37 and second main surface 38 of the semiconductor chip 30, or in other words the surfaces of the semiconductor chip 30 other than the first main surface 36, so as to surround the semiconductor chip 30. The extension portion 20 is preferably formed such that the level (height) of a first surface 20a thereof is substantially equal to the level of the first main surface 36 of the semiconductor chip 30.

The extension portion 20 may be formed by appropriately selecting an insulating material such as epoxy resin, for example. A conventionally applied so-called liquid resin or mold resin may be used.

In order to prevent warping of the semiconductor device 10 of this invention during the manufacturing process thereof, the extension portion 20 is preferably formed from an insulating material having a larger molding shrinkage than the molding shrinkage of a subsequently formed sealing portion.

Here, "molding shrinkage" indicates shrinkage of a single material occurring during a molding process. In other words, "molding shrinkage" corresponds to the sum of curing shrinkage at molding temperature and thermal contraction occurring during the return from molding temperature to normal temperature (similarly in the following descriptions).

More specifically, the extension portion 20 is preferably formed from a liquid resin having a coefficient of linear expansion within a lower temperature range than glass transition temperature of less than $1.5 \times 10^{-5}/°$ C., for example, and a modulus of elasticity within a range of 7.8 to 22 GPa. A case in which so-called mold resin is applied to the extension portion 20 will be described hereinafter.

An insulating film 40 is formed on the first surface 20a of the extension portion 20 and the first main surface 36 such that the plurality of electrode pads 34 is exposed.

A plurality of wiring patterns 42 is formed on the surface of the insulating film 40 so as to be electrically connected to the exposed electrode pads 34.

A sealing portion 44 is provided on the respective surface regions of the semiconductor chip 30 and extension portion 20 so as to cover the wiring patterns 42 and insulating film 40. The insulating film 40 and sealing portion 44 described above are also referred to collectively as an insulating layer 48. A plurality of electrode posts 46 are provided so as to pass from each of the wiring patterns 42 through the sealing portion 44 to reach the surface of the sealing portion 44. A part of the electrode posts 46 is provided on the upper side of (directly above) the semiconductor chip 30, and the remaining electrode posts 46 are provided on the upper side of (directly above) the extension portion 20. These electrode posts 46 are normally arranged at a constant pitch. The top surface of each electrode post 46 is exposed on the surface of the sealing portion 44. The electrode posts 46 are also referred to as post electrodes, and external terminals 47 are provided on the exposed top surface thereof. Solder balls 47a are usually provided as the external terminals 47. These external terminals 47 are arranged at a wider pitch than the arrangement pitch of the electrode pads 34.

Figure 2B:
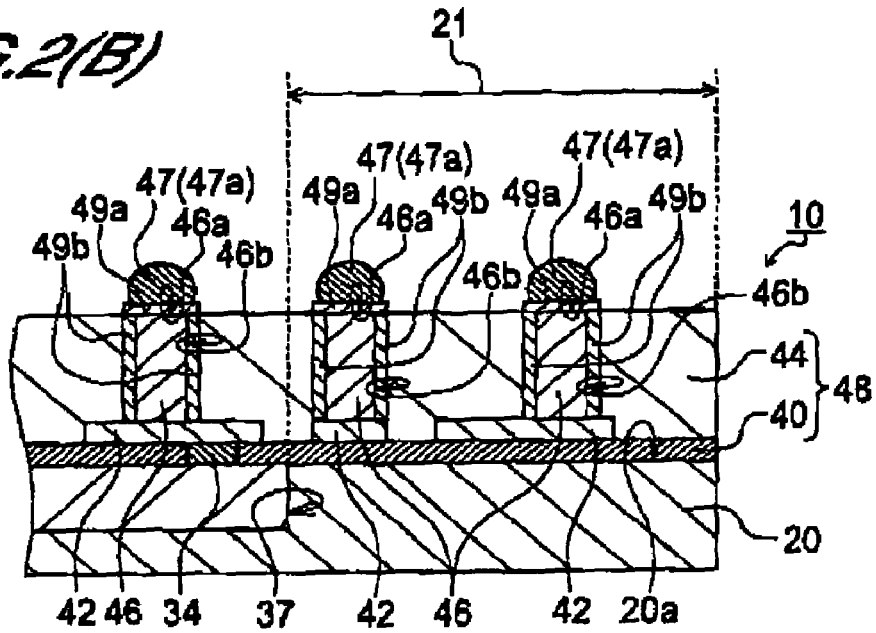

In FIG. 2(B). reference numerals 46a and 46b respectively indicate the top surface and side surface of the electrode posts 46, while reference numerals 49a and 49b respectively indicate a nickel film as a barrier metal layer and thin oxidation layer as a baffler metal layer.

Here, using FIG. 1(B), the connection relationships between the electrode pads 34 and wiring patterns 42 will be described. A partial region (the region surrounded by the solid line) 11 of FIG. 1(A) has been expanded and illustrated in order to facilitate understanding of these connection relationships. The wiring patterns 42 are constituted such that each of the electrode posts (shown as 46 in FIG. 2(A)) connected to the lower portion of the external terminals 47 is regularly and electrically connected to a corresponding electrode pad 34. A long wire 42a, a medium wire 42b, and a short wire 42c, for example, are provided as the wires which constitute each wiring pattern 42. These wires 42a, 42b, and 42c are respectively connected to the corresponding electrode pads 34 in a one-on-one connection relationship of one wire to one electrode pad. FIGS. 1(A) and 1(B) show that the electrode pads 34 are arranged In a line along a first direction (vertical In FIG. 1(B)). and the external terminals 47 are arranged in another line along a second direction (horizontal In fit 1(B)) that is perpendicular to the first direction, and the external terminals 47 are electrically connected to the electrode pads in a one-on-one connection relationship by the wiring patterns 42.

Hence the wiring patterns 42 are provided on the upper side of (directly above) the semiconductor chip 30 and on the upper side of (directly above) the extension portion 20, or in other words in a pattern leading from the electrode pads 34 to an extended region 21 side.

Accordingly, the portion 42X of the wiring patterns 42 in the vicinity of this boundary is preferably comprised of thicker and/or wider wire over a certain length. This is illustrated in plan-view FIG. 1(C) and cross sectional view 1(D), where the thicker or wider portion is shown in greater detail inside the dashed-line oval Indicated by reference numeral 42X.

In other words, portions of the wiring patterns on a boundary and vicinity thereof between semiconductor chip and the extension portion are formed wider or more thickly than other portions of said wiring patterns.

By forming the portion 42X of the patterns 42 at which stress is considered more likely, due to such phenomena as thermal stress and particularly an edge effect, to be thicker in this manner, operational reliability in the semiconductor device 10 is improved.

The region on the upper side of (directly above) the extension portion 20 is referred to as the extended region 21 due to the fact that an external terminal forming region extends beyond the surface region of the semiconductor chip 30. In this constitutional example, electrode posts 46 are also formed on the extended region 21.

The sealing portion 44 is formed so as to cover the wiring patterns 42 and electrode posts 46. The sealing portion 44 is formed such that a part of each of the electrode posts 46 is exposed.

The external terminals 47 are formed via the electrode posts 46. A constitution is also possible in which the external terminals are directly connected to the wiring patterns 42 without passing through the electrode posts by exposing a part of the wiring patterns 42 through the sealing portion 44.

In this constitutional example, the external terminals 47 are formed from solder balls 47a, for example. These solder balls 47a are provided in contact with the top surface of the electrode posts 46 and connected to the wiring patterns 42 via the electrode posts 46. The arrangement and pitch of adjacent electrode posts 46 may be set as desired in consideration of mounting onto a printed board or the like, for example.

Next, a manufacturing method for the semiconductor device of the first embodiment will be described with reference to FIGS. 3(A) to 10(B).

As a rule, each FIG. (A) is a partial schematic plan view for illustrating the constitution of the semiconductor device of this invention, and each FIG. (B) is a schematic sectional view showing a cross section severed along a broken line I—I of the corresponding FIG. (A). Note that FIGS. 6(B) and 7 are exceptions to this rule, showing an expanded view of the part of FIG. 6(A) surrounded by a solid line 11 and a sectional view severed along the I—I line in FIG. 6(A) respectively.

In the description of the manufacturing method for the semiconductor device of this invention, an example is illustrated in each of the drawings in which a plurality of semiconductor devices 10 is manufactured simultaneously by disposing a plurality of semiconductor chips in a 2 (vertical)×X (horizontal, X being a positive number of no less than 2) lattice formation on a lower base. However, this invention is not limited thereto, and semiconductor devices may be manufactured simultaneously by arranging a larger number of semiconductor chips in a larger lattice formation (similarly in the following embodiment).

Figure 3A:
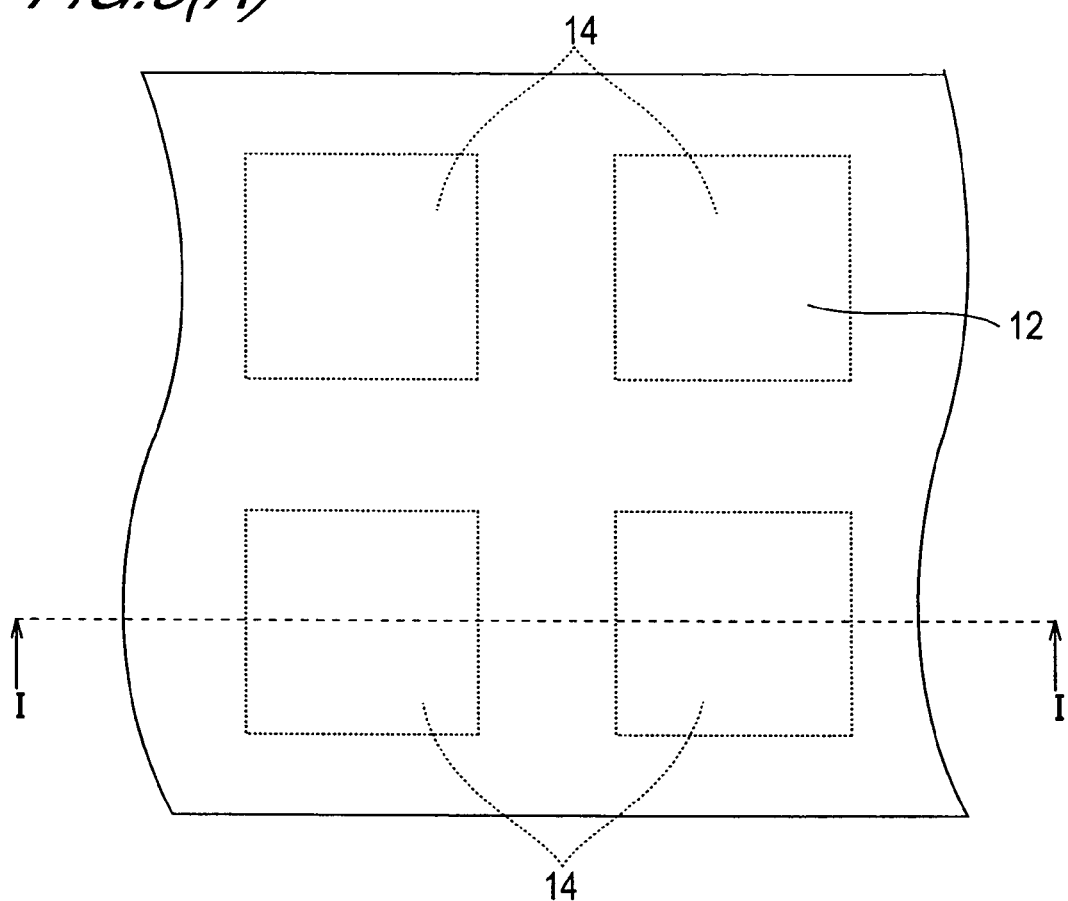
FIGS. 3(A) and 3(B) are a plan view seen from above and a sectional view (1) for illustrating a manufacturing method for the semiconductor device according to the first embodiment of this invention.
Figure 3B:
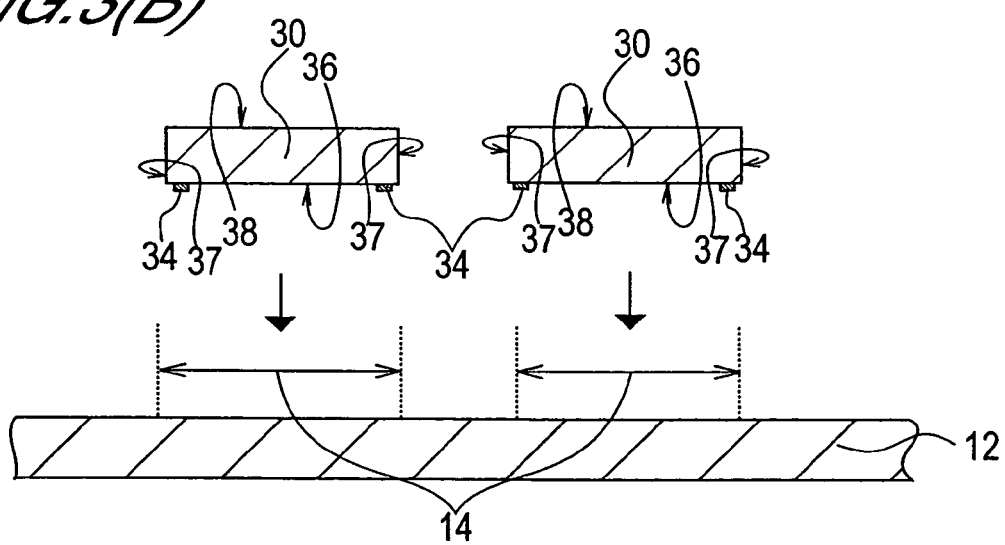

First, as shown in FIGS. 3(A) and 3(B), semiconductor chip disposal regions 14 on which the plurality of semiconductor chips 30 will be placed in a subsequent step are set in advance on a lower base 12.

Note that the profile of the semiconductor chip disposal region 14 substantially matches the profile of the first main surface 36 of the semiconductor chip 30. The intervals between adjacent semiconductor chip disposal regions 14 are set to be equal. This interval is preferably set to a sufficient value in consideration of the surface area of the lower base margin required when the semiconductor devices are separated, or in other words divided into individual units in a subsequent step, the surface area of the surface region of the extension portion which is formed in accordance with the desired number of external terminals, and so on.

Here, the lower base 12 may be formed from a plate-form or sheet-form body made of an organic material such as a glass epoxy or a polyimide, for example. Alternatively, the lower base 12 may be appropriately selected from a ceramic substrate, a metallic substrate, an Si substrate, or similar.

The surface of the lower base 12 is preferably formed from a member comprising adhesion means (not shown) which can be easily peeled away by heating, ultraviolet radiation, or other processing, for example.

As the member comprising easily peelable adhesion means, a thermal release sheet "Revalpha" (product name), manufactured by Nitto Denko Corporation, heat-resistant "Icros Tape" (product name) or the "SP Series" (product name), manufactured by Mitsui Chemicals Inc., or similar, all of which can be peeled away at a later stage, may be applied as the lower base 12 itself. Alternatively, a glass substrate or the like on whose surface an ultraviolet curable adhesive, for example, is painted to serve as adhesion means may be favorably applied.

Adhesion means which remain on the lower base 12 and are not transferred to the semiconductor chip 30 and extension portion 20 following the removing step should be selected.

Next, the set semiconductor chip disposal regions 14 are position aligned on the lower base 12 (see FIG. 3(B)). The semiconductor chips 30 are then placed on the semiconductor chip disposal regions 14.

A circuit element (not shown) having a predetermined function is formed on the first main surface 36 of the semiconductor chip 30. The first main surface 36 is provided with the electrode pads 34 which are electrically connected to the circuit element. The electrode pads 34 are provided in a plurality around the peripheral edge of the semiconductor chip 30. The semiconductor chip 30 also comprises the second main surface 38 which opposes the first main surface 36. The plurality of side surfaces 37 exists between the first main surface 36 and second main surface 38.

The semiconductor chip 30 is placed on the lower base 12 such that the first main surface thereof faces the semiconductor chip disposal region 14.

At this time, the semiconductor chip 30 placed on the lower base 12 is adhered to and held by the adhesion means provided on the surface of the lower base 12. Here, as shown in FIG. 4(B), the thickness of the electrode pads is substantially absorbed by the thickness of the adhesion means (not shown) provided on the lower base 12, and thus the level of the first main surface 36 is substantially equal to the level of the lower base 12.

Next, the extension portion 20 is formed on the entire surface of the lower base 12 in contact with the surfaces of the semiconductor chip 30, which is adhered to and held on the lower base 12, other than the first main surface 36, or in other words the side surfaces 37 and second main surface 38, and so as to surround the semiconductor chip 30.

The extension portion 20 may be formed such that the second main surface of the semiconductor chip 30 is exposed.

The extension portion 20 may be formed by appropriately selecting a material such as epoxy resin, for example. A conventionally applied so-called liquid resin or mold resin may also be applied.

The following methods, for example, are preferably used in the formation of the extension portion 20. Epoxy resin having a certain degree of viscosity, for example, serves as the material for the extension portion 20.

(1) The material is supplied by a dispensing method onto the lower base 12 comprising the semiconductor chip 30, whereupon the selected material is cured under the optimum conditions and processing for the material.

(2) The material is supplied by a precision printing method onto the lower base 12 comprising the semiconductor chip 30, whereupon the selected material is cured under the optimum conditions and processing for the material.

(3) The material is supplied by a photolithography method onto the lower base 12 comprising the semiconductor chip 30. Patterning is then performed by means of a well-known masking, exposing, and developing process under the optimum conditions for the selected material to form the extension portion 20.

The material of the extension portion 20 is a material such as paste-form epoxy resin having a certain degree of viscosity at room temperature, for example, which can be cured by suitable processing such as heating or ultraviolet radiation.

In order to prevent warping of the semiconductor device 10 during the manufacturing process, the extension portion 20 is preferably formed from a material having a larger molding shrinkage than the molding shrinkage of a subsequently formed sealing portion. More specifically, the extension portion 20 is preferably formed from a liquid resin having a coefficient of linear expansion within a lower temperature range than glass transition temperature of less than $1.5 \times 10^{-5}/°C$. and a modulus of elasticity within a range of 7.8 to 22 GPa.

Dimensional accuracy in the direction of thickness may be improved particularly when mold resin is applied to the extension portion 20, as a result of which the extension portion 20 may be formed with a higher degree of precision.

As described above, the level of the first surface 20a of the extension portion 20 is formed to be substantially equal to the level of the first main surface 36 of the semiconductor chip 30 following curing processing.

Next, the lower base 12 is removed from the first surface 20a of the extension portion and the first main surface 36 by being peeled away therefrom, whereupon the semiconductor device 10 is turned over such that the first surface 20a of the extension portion and the first main surface 36 form an upper surface.

Figure 5A:
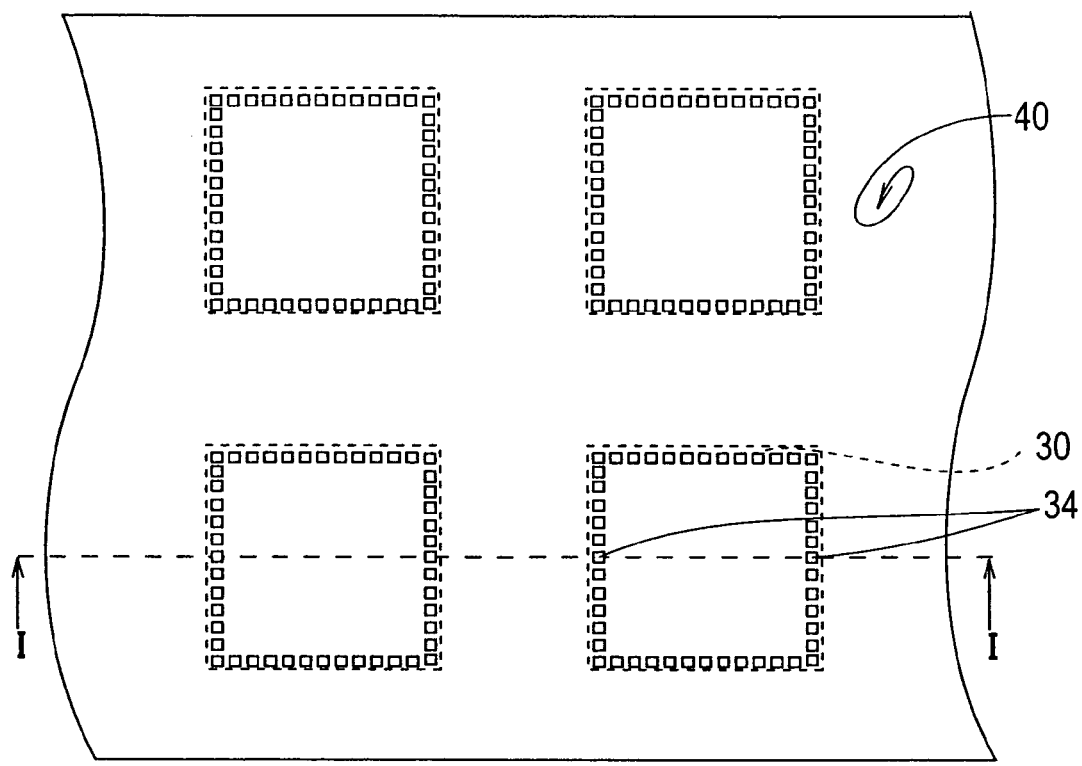
FIGS. 5(A) and 5(B) are a plan view seen from above and a sectional view (3) for illustrating the manufacturing method for the semiconductor device according to the first embodiment of this invention.
Figure 5B:
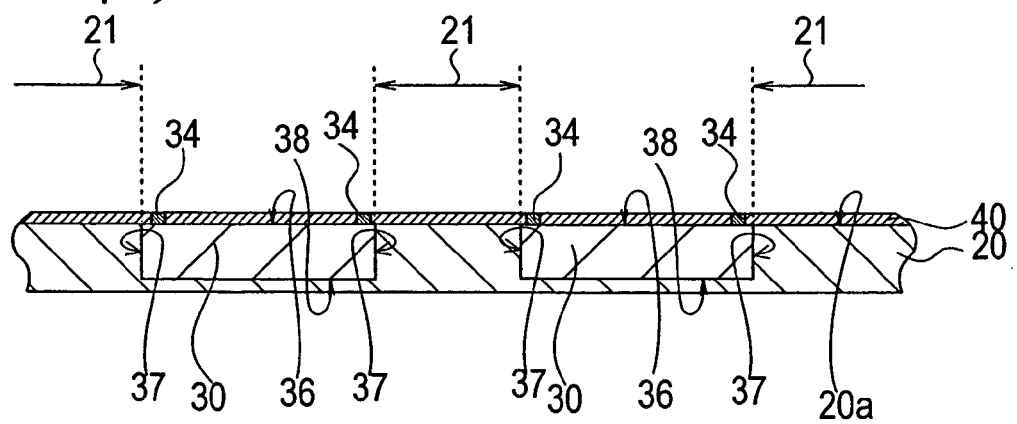

Then, as shown in FIG. 5, the insulating film 40 is formed on the first main surface 36 and first surface 20a of the extension portion 20. Here, the insulating film 40 is formed such that a part of the electrode pads 34 on the semiconductor chip 30 is exposed on the insulating film 40.

If, for example, a height difference occurs between the surface of the extension portion 20 and the surface of the semiconductor chip 30, or an undulation or depression occurs on the surface of the extension portion 20, or similar, the material for forming the insulating film 40 may be used to form the insulating film 40 evenly such that the height difference, undulation, and/or depression are reduced to a degree at which wiring patterns may be formed. In so doing, the subsequent wiring pattern forming step and electrode post forming step may be performed with a greater degree of stability, whereby the effect of an improvement in the reliability of the semiconductor device 10 is obtained.

Next, as shown in FIGS. 6 and 7, a wiring pattern 42 comprising a variety of patterns is formed on the surface of the insulating film 40.

More specifically, the wire width, wire spacing, optimum angles, and so on are determined in accordance with applicable wiring process rules such that connections can be made at the shortest possible distances. As shown in the drawings, for example, a plurality of wiring pattern groups, each comprising the long wire 42a, medium wire 42b, and short wire 42c, is formed in respect of the plurality of electrode pads 34 formed around the peripheral edge of the semiconductor chip 30 at the shortest possible distances, and one end portion of each wire is connected to the corresponding electrode pad 34. An electrode post mounting pad is formed on the other end portion so that an external terminal 47 (solder ball 47a) can be connected thereto via an electrode post. Thus the wiring pattern 42 is formed comprising patterns which are extended from the electrode pads 34 to the extended region 21 side.

Figure 4A:
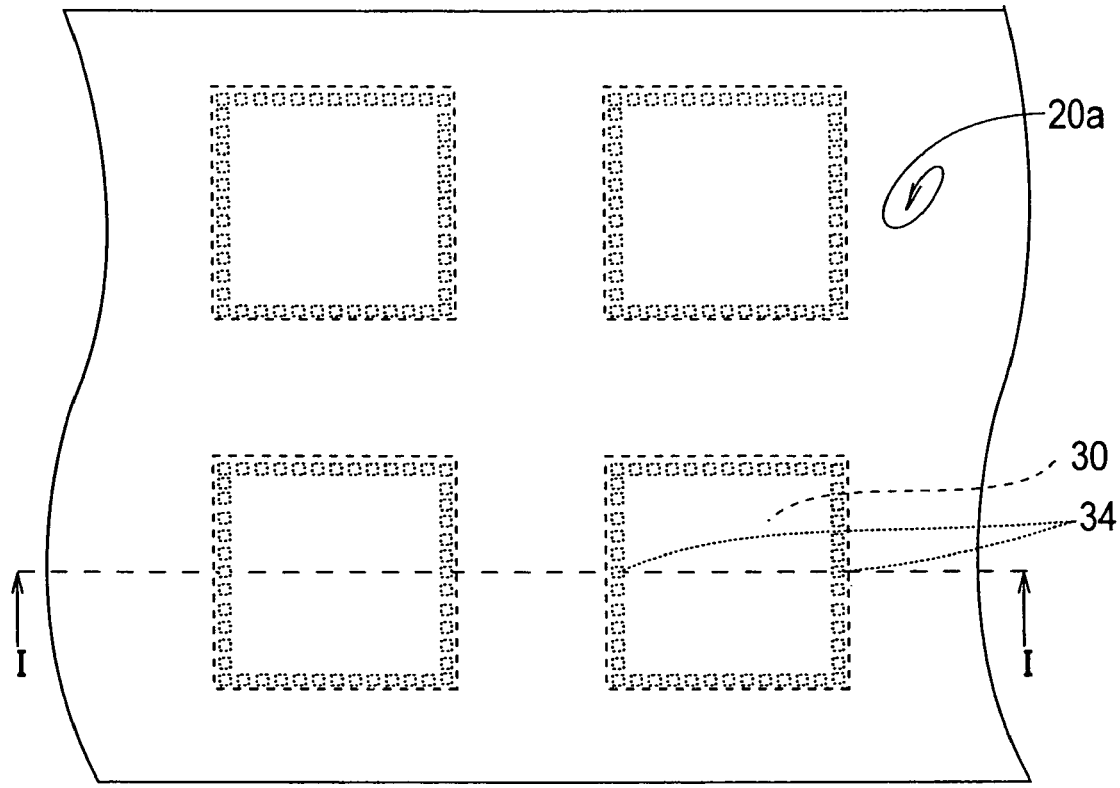
FIGS. 4(A) and 4(B) are a plan view seen from above and a sectional view (2) for illustrating the manufacturing method for the semiconductor device according to the first embodiment of this invention.
Figure 4B:
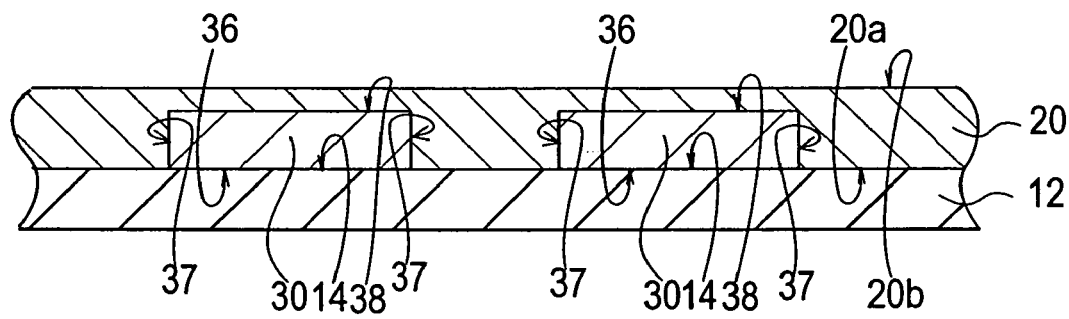
Figure 6A:
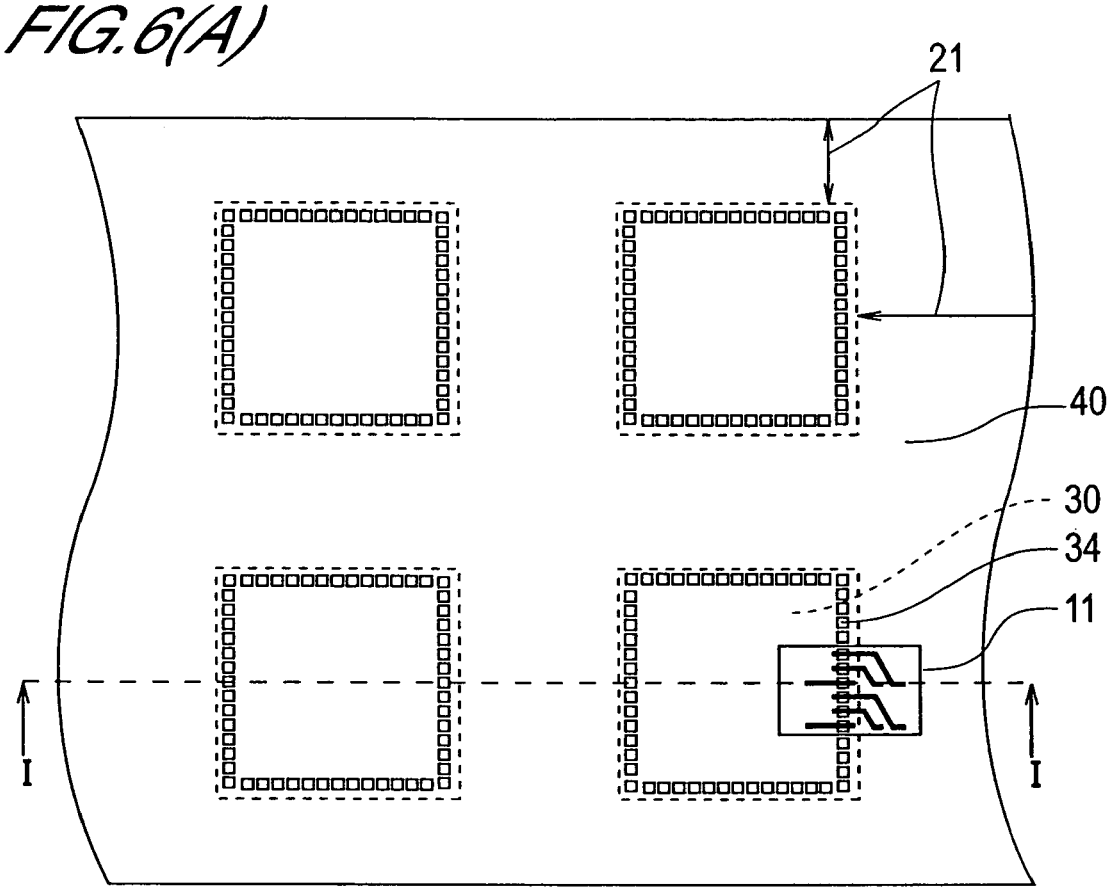
FIGS. 6(A) and 6(B) are a plan view seen from above and an expanded plan view of the main parts thereof (4) for illustrating the manufacturing method for the semiconductor device according to the first embodiment of this invention.
Figure 6B:
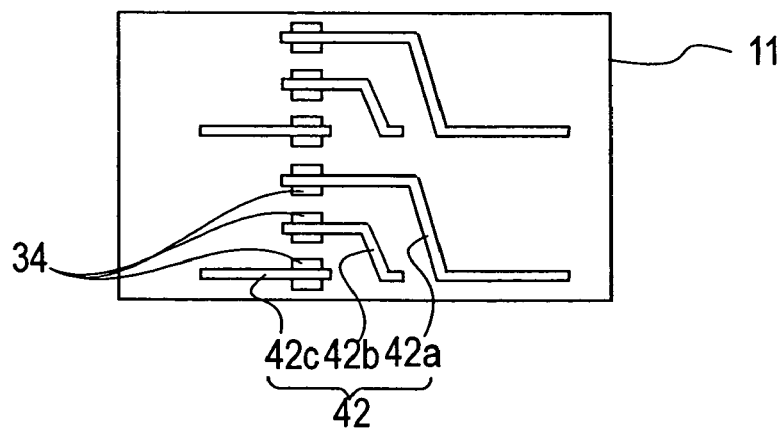
Figure 7:
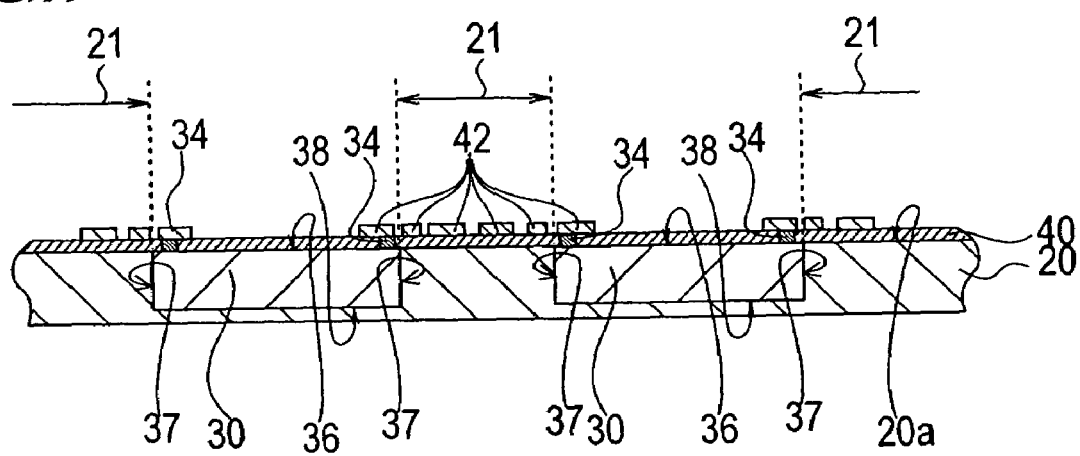
FIG. 7 is a schematic sectional view (4-2) for illustrating the manufacturing method for the semiconductor device according to the first embodiment of this invention.

Note that to facilitate description, the disposed electrode pads 34 in FIGS. 4(A), 5(A) and 6(A) are illustrated schematically in a smaller number than the actual number.

The wiring pattern 42 may be formed on the surface region of the insulating film 40 by means of a wiring pattern formation process such as sputtering or photolithography in a well-known WCSP manufacturing process in a region corresponding to the upper side of (directly above) the extension portion 20, or in other words a desired region on the insulating film 40 including the extended region 21.

The material used to form the wiring pattern 42 may be selected appropriately at will, but is preferably a material such as aluminum, copper, or a metal alloy.

If, in the wiring pattern 42 forming step, a portion 42X in which stress is concentrated occurs on the wiring pattern 42 due to the aforementioned height difference, the region of the wiring pattern 42 which substantially includes the portion 42X in which stress is concentrated may be formed slightly thicker and/or wider.

In other words, portions of the wiring patterns on a boundary and vicinity thereof between semiconductor chip and the extension portion are formed wider or more thickly than other portions of said wiring patterns.

Figure 8A:
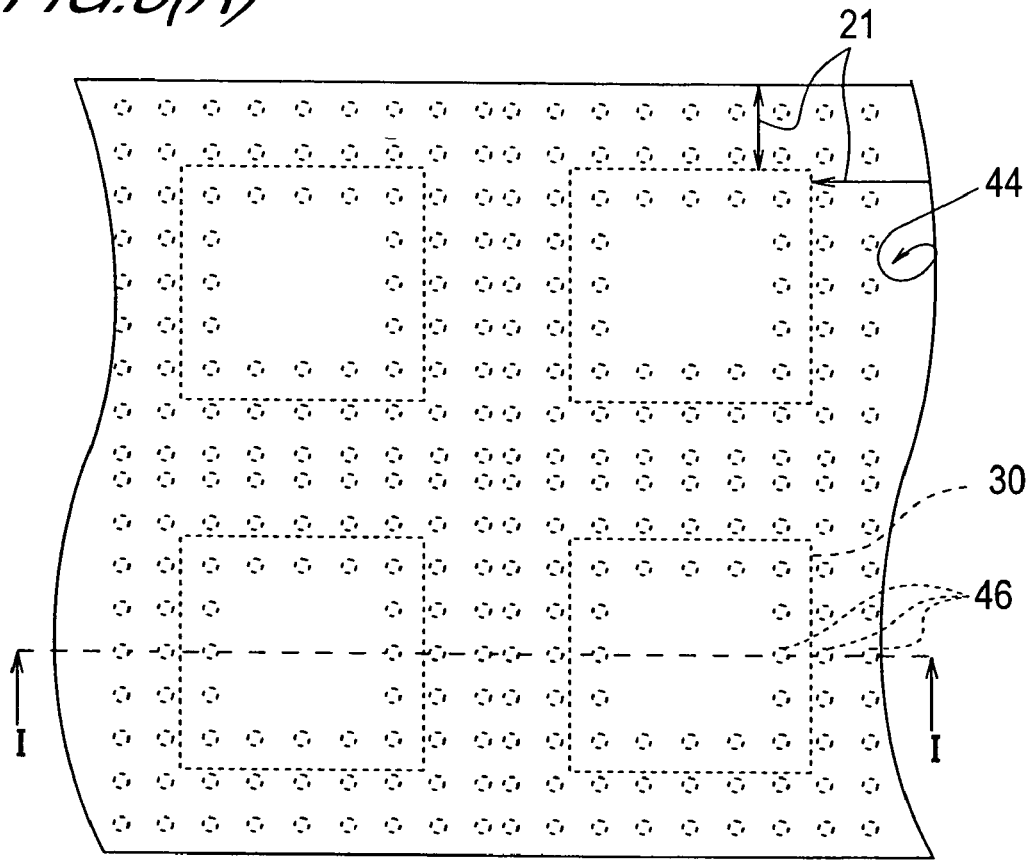
FIGS. 8(A) and 8(B) are a plan view seen from above and a sectional view (5) for illustrating the manufacturing method for the semiconductor device according to the first embodiment of this invention.
Figure 8B:
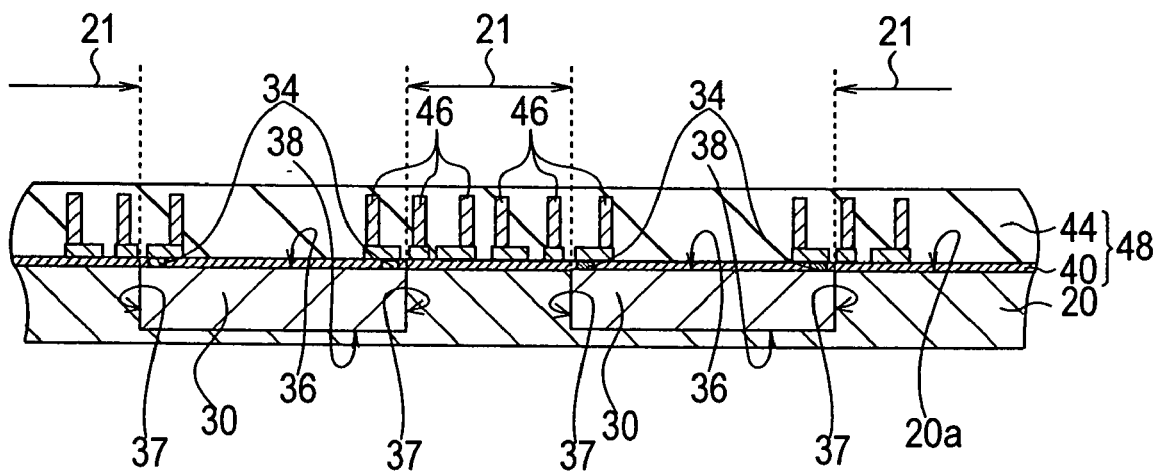

Next, as shown in FIGS. 8(A) and 8(B), electrode posts are formed on the surface of each wiring pattern 42 so as to be electrically connected thereto. The electrode posts 46 are provided in the surface region of the extended region 21 on the upper side of (directly above) the extension portion 20 and in the region on the upper side of (directly above) the semiconductor chip 30. The electrode posts 46 are formed in a lattice formation, for example, and arranged at a predetermined pitch. As described above, this pitch may be set in consideration of mounting, or in other words as either a constant or irregular pitch.

After an appropriate material has been selected, the electrode posts 46 may be formed by means of an electrode post 46 forming process in a well-known WCSP manufacturing process such as plating or photolithography.

The sealing portion 44 is then formed so as to cover the wiring pattern 42 and electrode posts 46 formed on the first surface 20a of the extension portion 20 and the semiconductor chip 30. If external terminals are to be formed without passing through the electrode posts 46, the sealing portion 44 may be formed such that a part of the wiring pattern 42 in the positions at which external terminals are to be formed is exposed.

This sealing step may be implemented by means of a well-known method using a well-known sealing material such as an epoxy mold resin.

A general use mold resin has the following property values, for example: a linear expansion coefficient at a lower temperature than glass transition temperature within a range of 0.6 to $1.3 \times 10^{-5}/°$ C.; a glass transition temperature (Tg) within a range of 125 to 220° C.; and a modulus of elasticity within a range of 9.8 to 24 GPa (1000 to 2450 kg/mm$^2$). A mold resin having these values may be favorably applied to the semiconductor device 10 of this invention.

As described above, and particularly when the extension portion 20 is formed from a so-called mold resin similarly to the sealing portion 44, the insulating material is determined such that the molding shrinkage thereof is larger than that of the sealing portion 44 in order to prevent warping of the semiconductor device 10 during the manufacturing process. The following combinations can be cited as examples of the properties of the mold resin used for forming the extension portion 20 and sealing portion 44.

(1) Extension portion/sealing portion: the properties of the extension portion mold resin are a linear expansion coefficient in a lower temperature range than glass transition temperature within a range of 1.1 to $1.5 \times 10^{-5}/°$ C. and a glass transition temperature (Tg) which is larger than 170° C.; the properties of the sealing portion mold resin are a linear expansion coefficient in a lower temperature range than glass transition temperature of less than $1.0 \times 10^{-5}/°$ C., a glass transition temperature (Tg) within a range of 125 to 220° C., and a modulus of elasticity within a range of 14.7 to 24 GPa (1500 to 2450 kg/mm$^2$).

(2) Extension portion/sealing portion: the properties of the extension portion mold resin are a linear expansion coefficient in a lower temperature range than glass transition temperature within a range of 1.1 to $1.7 \times 10^{-5}/°$ C., a glass transition temperature (Tg) which is lower than 170° C., and a modulus of elasticity within a range of 9.8 to 19.6 GPa (1000 to 2000 kg/mm$^2$); the properties of the sealing portion mold resin are a linear expansion coefficient in a lower temperature range than glass-transition temperature of less than $1.0 \times 10^{-5}/°$ C., a glass transition temperature (Tg) within a range of 125 to 220° C., and a modulus of elasticity within a range of 14.7 to 24 GPa (1500 to 2450 kg/mm$^2$).

(3) Extension portion/sealing portion: the properties of the extension portion mold resin are a linear expansion coefficient in a lower temperature range than glass transition temperature within a range of 1.1 to $1.7 \times 10^{-5}/°$ C., a modulus of elasticity of 13.7 GPa (1400 kg/mm$^2$), and a glass transition temperature (Tg) within a range of 125 to 170° C.; the properties of the sealing portion mold resin are a linear expansion coefficient in a lower temperature range than glass transition temperature of less than $1.0 \times 10^{-5}/°$ C., a glass transition temperature (Tg) within a range of 125 to 220° C., and a modulus of elasticity within a range of 14.7 to 24 GPa (1500 to 2450 kg/mm$^2$).

Figure 9A:
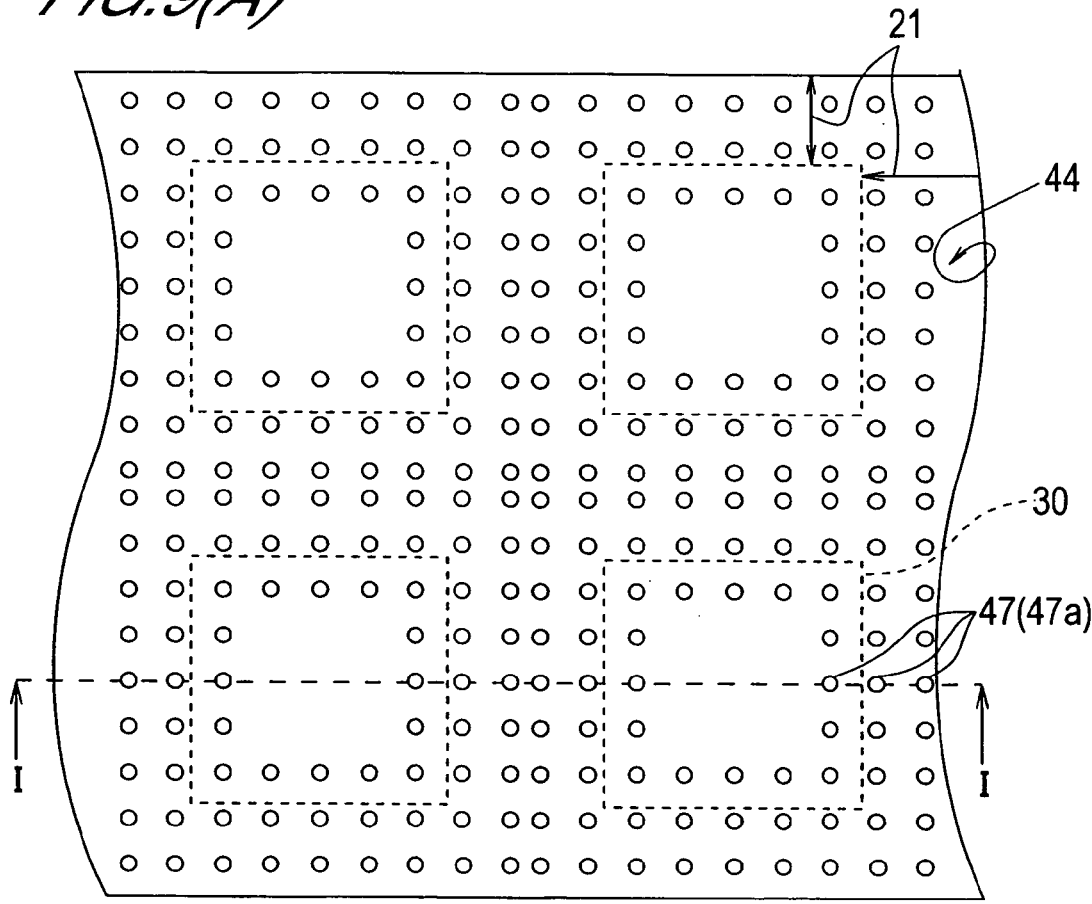
FIGS. 9(A) and 9(B) are a plan view seen from above and a sectional view (6) for illustrating the manufacturing method for the semiconductor device according to the first embodiment of this invention.
Figure 9B:
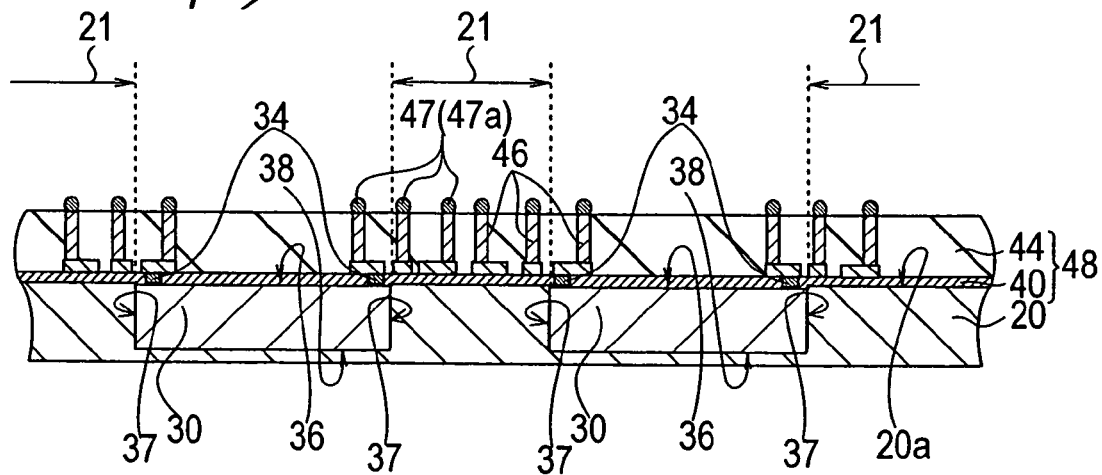

Next, as shown in FIGS. 9(A) and 9(B), the surface side of the sealing portion 44 is trimmed such that the top surface (also referred to as the upper surface) of the electrode posts 46 is exposed.

This process is performed using a well-known grinding or polishing process.

A method such as film formation may also be applied to the formation of the sealing portion 44. In this case, substantially no load is placed on the electrode posts 46. Also in this case, the sealing portion 44 can be formed such that the top surface of the electrode posts 46 is directly exposed on the surface of the sealing portion 44 without the need for a grinding process on the sealing portion 44 as described above.

Any suitable processing required from a design point of view may be performed on the exposed top surface of the electrode posts 46. If copper is used as the material for the electrode posts 46, for example, an Ni (nickel) film or the like may be formed on the top surface of the electrode posts 46 as a barrier metal layer.

Next, solder balls 47a, for example, serving as the external terminals 47 are formed via the electrode posts 46 exposed on the surface of the sealing portion 44 on the upper surface thereof.

Figure 10A:
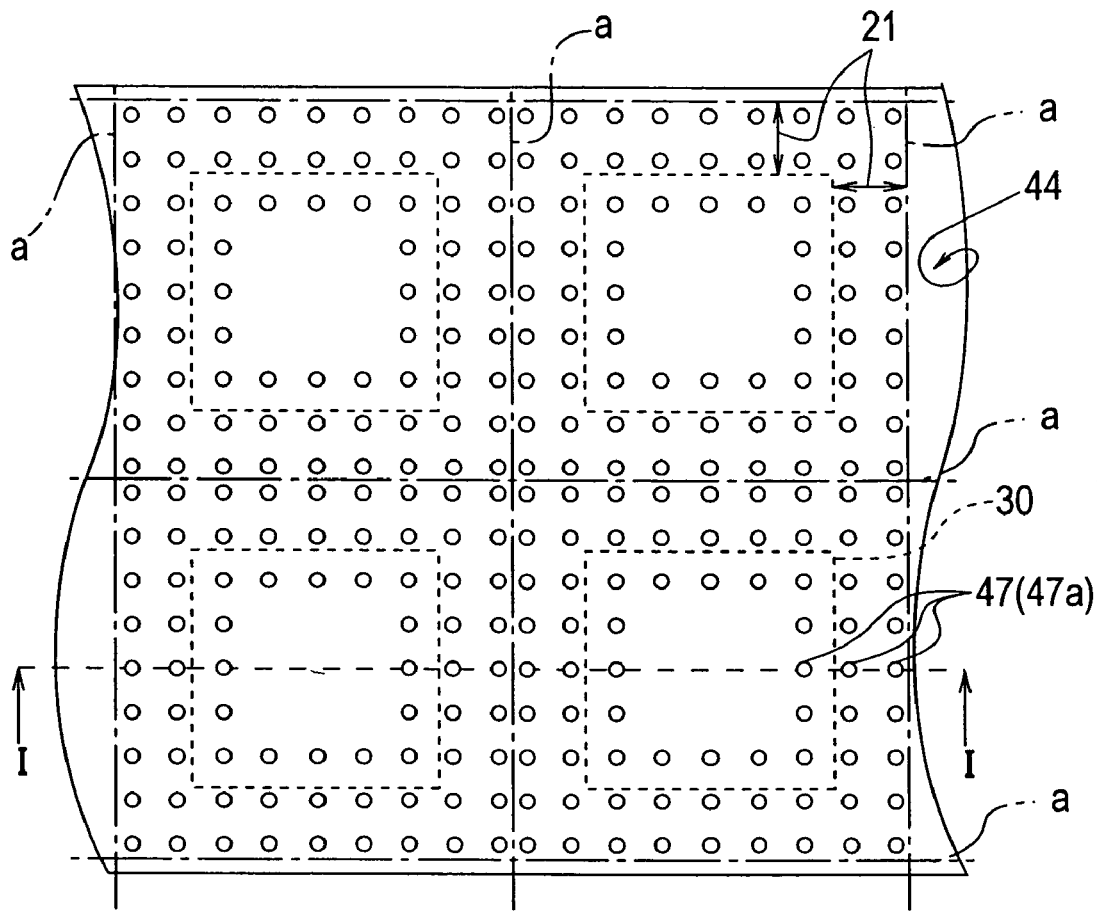
FIGS. 10(A) and 10(B) are a plan view seen from above and a sectional view (7) for illustrating the manufacturing method for the semiconductor device according to the first embodiment of this invention.
Figure 10B:
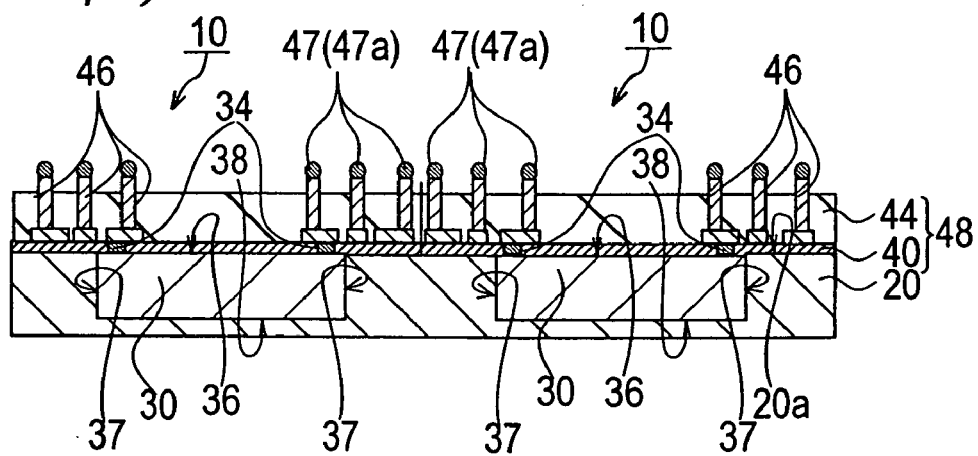

Next, as shown in FIGS. 10(A) and 10(B), the plurality of semiconductor chips are severed along a cutting line shown in the drawings by a dot/dash line a to provide constitutional bodies comprising a single semiconductor device having a predetermined function.

This singularization process is preferably performed by cutting using a blade which rotates at high speed.

Since a so-called WCSP manufacturing process can be applied to the manufacturing method of the first embodiment, the semiconductor device 10 can be manufactured by means of a simple process without the need for any special semiconductor device manufacturing processes.

Second Embodiment

Figure 11A:
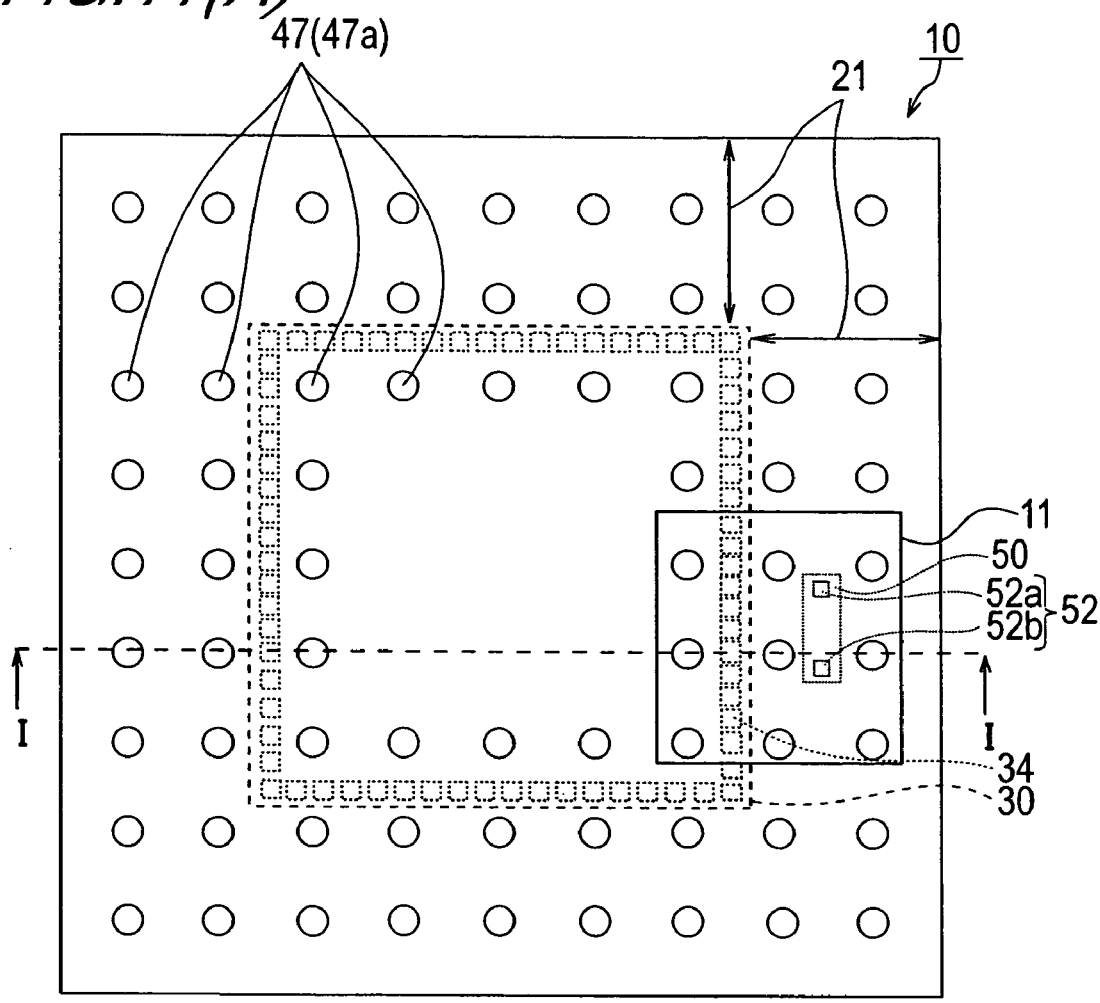
FIGS. 11(A) and 11(B) are a schematic plan view seen from above and a sectional view for illustrating the constitution of a semiconductor device according to a second embodiment of this invention.
Figure 11B:
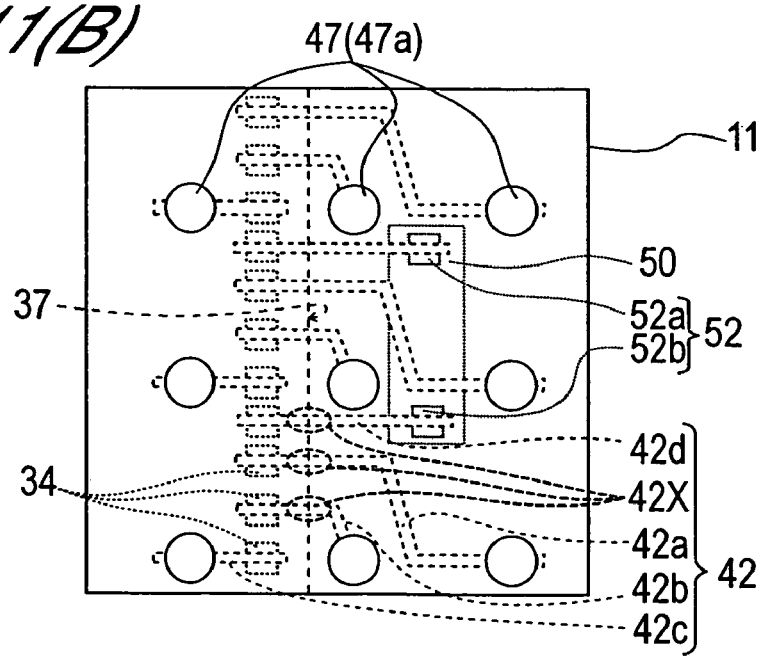
Figure 12:
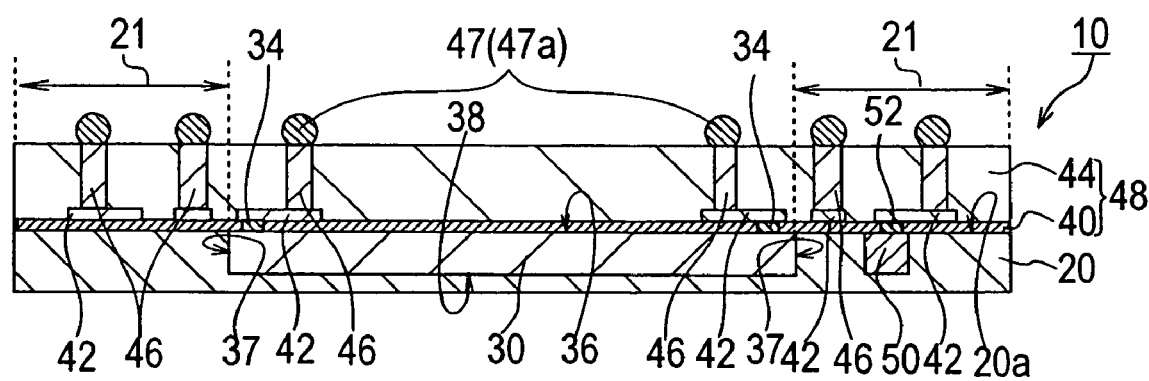
FIG. 12 is a schematic sectional view for illustrating the constitution of the semiconductor device according to the second embodiment of this invention.

A semiconductor device according to a second embodiment of this invention will now be described with reference to FIGS. 11 and 12. FIG. 11(A) is a schematic plan view seen from above for illustrating the constitution of the semiconductor device of the second embodiment, and FIG. 11(B) is an expanded plan view showing in outline the main parts of a partial region of FIG. 11(A) for illustrating the connection relationship between a wiring pattern and electrode pads. FIG. 12 is a schematic sectional view showing a cross section severed along a broken line I—I of FIG. 11(A). Note that applied materials, process implementation conditions, and so on are substantially identical to those of the first embodiment, and hence detailed description thereof has been omitted. Note also that in each drawing, the plan view is similar to that described in the first embodiment, and hence as a rule, illustration and detailed description thereof have been omitted.

A semiconductor device 10 according to the second embodiment of this invention features a passive element 50 which is buried in an extension portion 20.

The semiconductor device 10 comprises a semiconductor chip 30. The semiconductor chip 30 comprises a circuit element (not shown) having a predetermined function. The semiconductor chip 30 comprises a first main surface 36 on which a plurality of electrode pads 34, which are electrically connected to the circuit element, is provided and a second main surface 38 which opposes the first main surface 36. A plurality of side surfaces 37 exists between the first main surface 36 and second main surface 38. The plurality of electrode pads 34 is formed around the peripheral edge of the first main surface 36.

The semiconductor device 10 also comprises the extension portion 20. The extension portion 20 is provided in contact with the side surfaces 37 and second main surface 38 of the semiconductor chip 30, or in other words the surfaces of the semiconductor chip 30 other than the first main surface 36, so as to surround the semiconductor chip 30. The extension portion 20 is preferably formed such that the level of a first surface 20a thereof is substantially equal to the level of the first main surface 36 of the semiconductor chip 30.

In order to prevent warping of the semiconductor device 10 of this invention during the manufacturing process thereof, the extension portion 20 is preferably formed from an insulating material having a larger molding shrinkage than the molding shrinkage of a subsequently formed sealing portion.

More specifically, the extension portion 20 is preferably formed from a liquid resin having a coefficient of linear expansion within a lower temperature range than glass transition temperature of less than $1.5 \times 10^{-5}/°$ C. and a modulus of elasticity within a range of 7.8 to 22 GPa.

As shown in FIG. 11(B), the passive element 50 comprising a plurality of connection terminals 52 which includes a first connection terminal 52a and a second terminal 52b is provided on the extension portion 20, for example.

A filter or the like comprising a capacitor, an inductor, a resistor, a resonance filter (SAW type or FBAR type), and so on, may be cited as an applicable passive element 50. Alternatively, a plurality of passive elements of the same type or various types may be combined to provide a passive element which exhibits a predetermined function.

An insulating film 40 is formed on the first surface 20a of the extension portion 20 and the first main surface 36 such that a part of each of the electrode pads 34 and a part of each of the connection terminals 52 are exposed.

A wiring pattern 42 and the connection terminals 52 are formed to be electrically connected to the exposed electrode pads 34, respectively.

Here, the connection relationship of the electrode pads 34 and connection terminals 52 with the wiring pattern 42 will be described using FIG. 11(B). To facilitate understanding thereof, a partial region of FIG. 11(A) has been expanded and illustrated as FIG. 11(B).

The wiring pattern 42 is electrically and regularly connected to the electrode posts (not shown, see FIG. 12) positioned beneath and connected to the external terminals 47 (solder balls 47a), and to the corresponding electrode pads 34. The wiring pattern 42 is preferably connected at the shortest possible distances in accordance with applicable wiring process rules by determining the wire width, wire spacing, optimum angles, and so on.

When the wiring pattern 42 is directly connected to the electrode pads 34 and external terminals in particular, the wires which constitute the wiring pattern 42 comprise a long wire 42a, a medium wire 42b, and a short wire 42c. These wires 42a, 42b, and 42c are connected to the corresponding electrode pads 34 in a one-on-one connection relationship of one wire to one electrode pad.

Also in the semiconductor device 10 of this embodiment, the first connection terminal 52a and second connection terminal 52b of the passive element 50 which is buried in the extension portion 20 are each electrically connected to different electrode pads 34 by a wiring pattern 42d.

The wiring patterns 42 are formed in a region on the upper side of (directly above) the semiconductor chip 30 and the upper side of (directly above) the extension portion 20, or in other words are extended from the electrode pads 34 to the extended region 21 side.

The region on the upper side of (directly above) the extension portion 20 is referred to as the extended region 21 due to the fact that the external terminal forming region extends beyond the surface region of the semiconductor chip 30. In this constitutional example, electrode posts 46 and external terminals 47 are also formed on the extended region 21.

In this constitutional example, the external terminals 47 are formed from the solder balls 47a, for example. These solder balls 47a are provided on the top surface of and in contact with the electrode posts 46 so as to be connected to the wiring patterns 42 via the electrode posts 46. The arrangement and pitch of adjacent electrode posts 46 may be set as desired in consideration of mounting onto a printed board or the like, for example.

As described above, the electrode posts 46 are provided not only within a surface range corresponding to the upper side of the semiconductor chip 30, but also on the upper side of the extension portion 20, or in other words on the extended region 21. As a result, design freedom in the disposal positions and disposal pitch of the electrode posts 46 is increased. In other words, restrictions on the disposal pitch of the electrode posts 46, and hence the external terminals 47, are eased such that mounting is facilitated, and thus the electrode posts 46 can be formed at wider intervals in accordance with the constitutional requirements on the mounting substrate side, for example. More specifically, external electrodes can be formed at an appropriate disposal pitch by appropriately adjusting the surface area of the extension portion 20.

The connection relationship of the passive element 50 in accordance with the wiring pattern 42d may be set in consideration of mounting onto a mounting substrate or the specifications and system design of an electronic device in which the semiconductor device 10 is incorporated, for example. A connection relationship is possible in which only the first connection terminal 52a of the passive element 50 is connected to the electrode pad 34 and the second connection terminal 52b is connected to a subsequently formed external terminal, for example. Alternatively, the first and second connection terminals 52a and 52b of the passive element 50 may be respectively connected to different external terminals such that when mounted onto a mounting substrate, the passive element 50 functions by being incorporated into the mounting substrate side.

Similar effects to the semiconductor device 10 described in the first embodiment may be obtained in the semiconductor device 10 of the second embodiment.

Further, according to the semiconductor device 10 of the second embodiment, a passive element which conventionally is placed on a substrate and packaged together with a semiconductor chip can be packaged when provided on the extension portion, and thus, in addition to the aforementioned effects, the number of components mounted onto a mounting substrate can be reduced. Accordingly, the size of the mounting substrate itself can be reduced. The passive element can also be provided closer to the semiconductor chip, and thus when a capacitor is provided as the passive element, for example, parasitic inductance produced when the length of a wiring path from the semiconductor chip to the capacitor increases can be reduced. As a result, noise generation can be reduced. Moreover, the passive element does not exist in the region on the upper side of the circuit element which is formed on the semiconductor chip, and thus electromagnetic interference between the circuit element and passive element can be effectively prevented.

Next, a manufacturing method for the semiconductor device of the second embodiment will be described with reference to FIGS. 13(A) through 16(C).

Figure 14A:
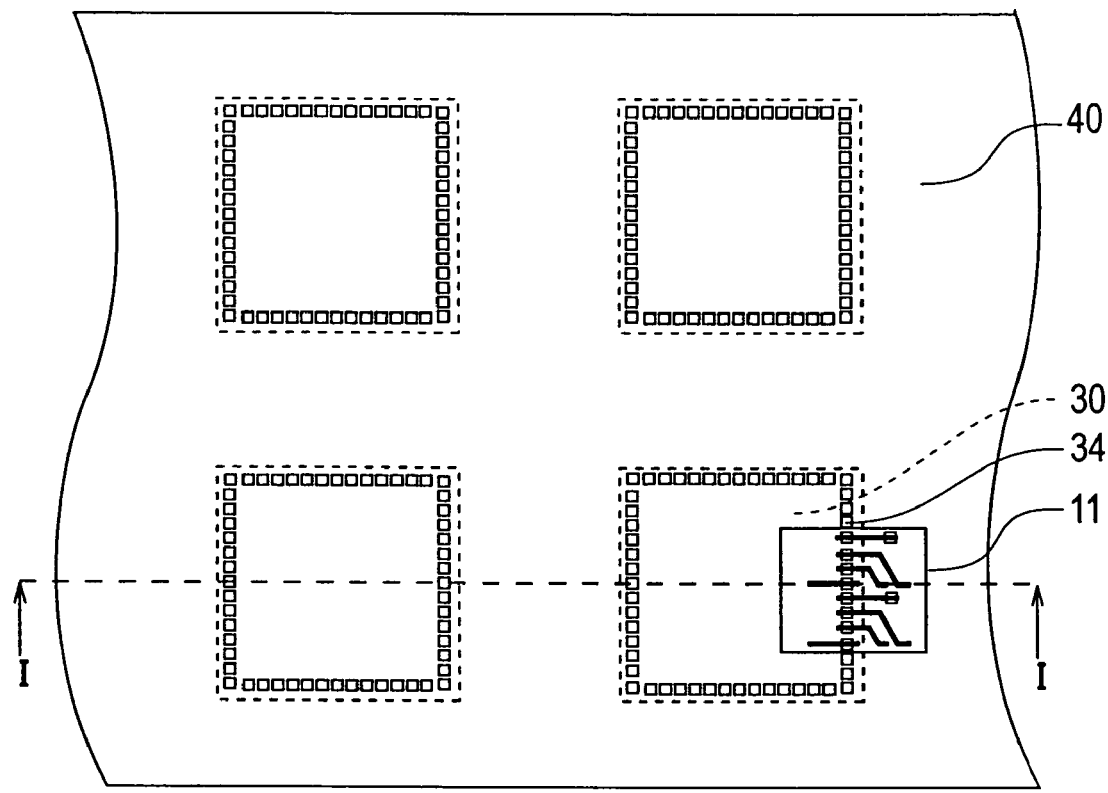
FIGS. 14(A) and 14(B) are a schematic plan view and an expanded view of the main parts thereof for illustrating the manufacturing method for the semiconductor device according to the second embodiment of this invention.
Figure 14B:
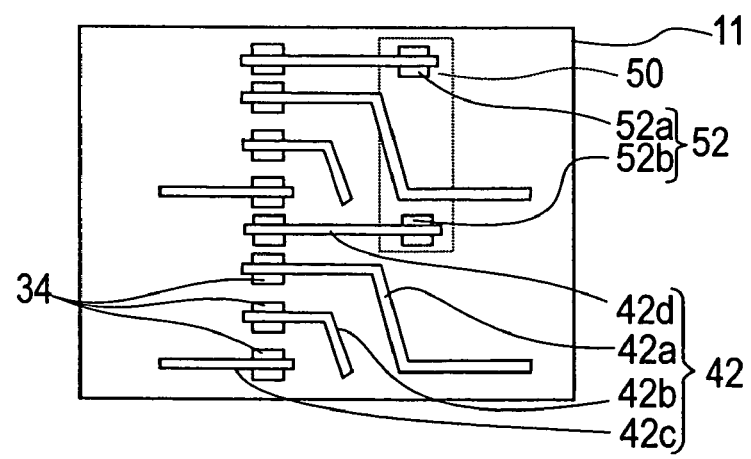
Figure 15:
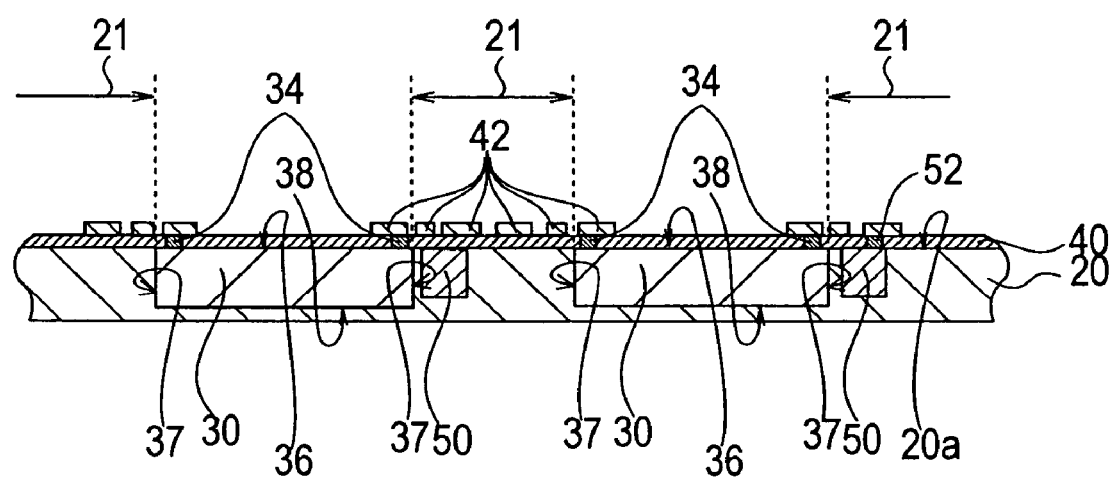
FIG. 15 is a schematic sectional view (2) for illustrating the manufacturing method for the semiconductor device according to the second embodiment of this invention.

Each drawing is a schematic sectional view for illustrating the constitution of the semiconductor device 10 of the second embodiment. The plan views are similar to those of the first embodiment and hence illustration and detailed description thereof have been omitted. In FIG. 14, to facilitate understanding, FIG. 14(A) shows a schematic plan view seen from above, and an expanded view of the main parts thereof is shown in FIG. 14(B). The sectional view corresponding to FIG. 14(A) is shown in FIG. 15.

Figure 13A:
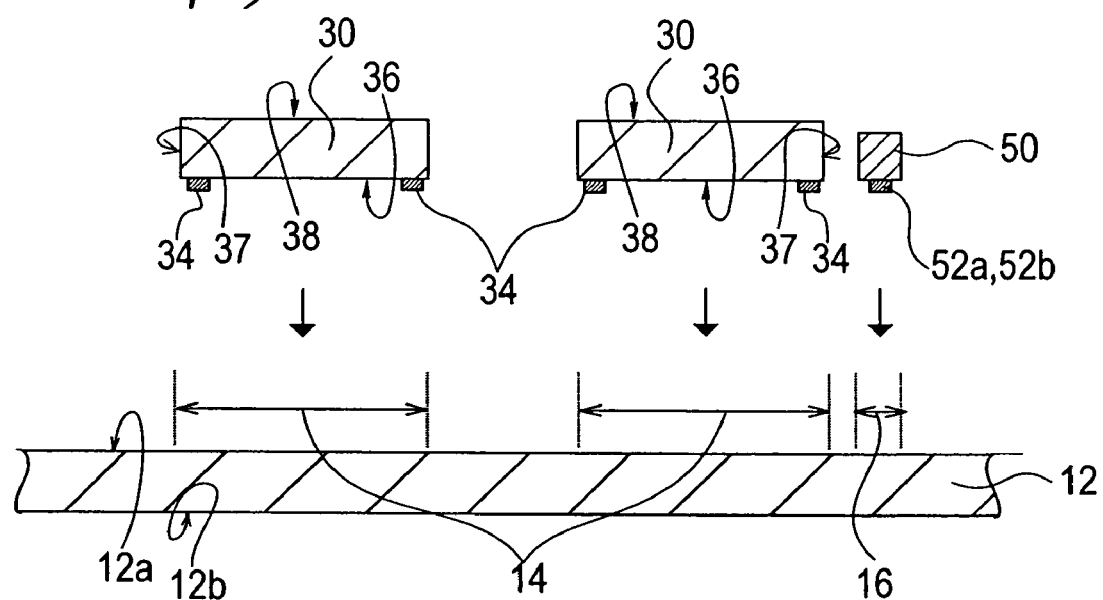
FIGS. 13(A) and 13(B) are schematic sectional views (1) for illustrating a manufacturing method for the semiconductor device according to the second embodiment of this invention.
Figure 13B:
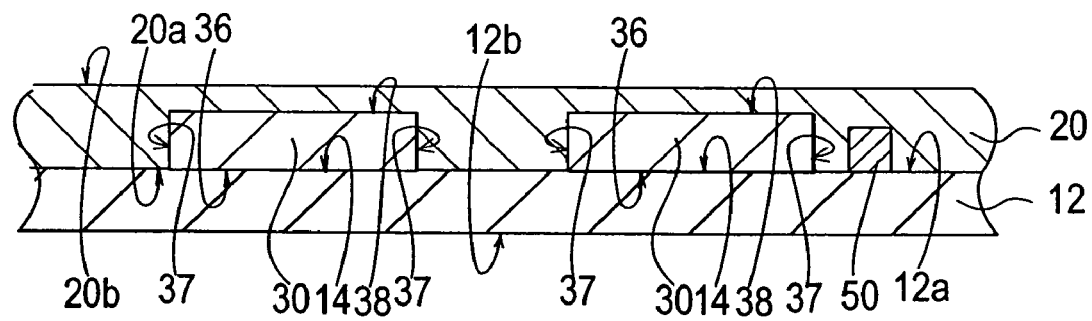

First, as shown in FIGS. 13(A) and 13(B), semiconductor chip disposal regions 14 on which the plurality of semiconductor chips 30 will be placed in a subsequent step are set in advance on the lower base 12. Passive element disposal regions 16 are then set surrounding the semiconductor chip disposal regions 14. The intervals between the plurality of semiconductor chip disposal regions 14 are set to be equal. This interval is determined in consideration of the surface area of the margin required during the singularization step, the surface area of the extension portion 20 which is formed in accordance with the desired number and size of the external terminals, and so on.

As described above, the surface of the lower base 12 is preferably constituted by a member comprising adhesion means (not shown) which can be easily peeled away by heating, ultraviolet radiation, or other processing, for example.

Next, the set semiconductor chip disposal regions 14 are position aligned on the lower base 12 and the semiconductor chips 30 are placed thereon.

A circuit element (not shown) having a predetermined function is formed on the semiconductor chip 30. The semiconductor chip 30 comprises the first main surface 36. The first main surface 36 is provided with the electrode pads 34 which are electrically connected to the circuit element. The electrode pads 34 are provided in a plurality around the peripheral edge of the semiconductor chip 30. The semiconductor chip 30 also comprises the second main surface 38 which opposes the first main surface 36 and the plurality of side surfaces 37 between the first main surface 36 and second main surface 38.

The semiconductor chip 30 is placed on the lower base 12 such that the first main surface 36 thereof faces the semiconductor chip disposal region 14.

The set passive element disposal regions 16 are then position aligned on the lower base 12 and the passive elements 50 are placed thereon.

The passive element 50 is placed on the lower base 12 such that the connection terminals 52 thereof are electrically connected to the electrode pads 34 on the semiconductor chip 30 and/or the external terminals.

In the constitutional example of the second embodiment, the first connection terminal 52a and second connection terminal 52b of the passive element 50 are placed on the lower base 12 facing the passive element disposal region 16.

The semiconductor chip 30 and passive element 50 placed on the lower base 12 are adhered to and held by adhesion means provided on a first surface 12a of the lower base 12. Here, the thickness of the electrode pads 34 and the first and second connection terminals 52a and 52b is substantially absorbed by the thickness of the adhesion means provided on the lower base, and hence in the drawing, the level of the surface on which the first main surface 36 of the semiconductor chip 30 and the connection terminals 52 of the passive element 50 are provided is substantially equal to the level of the first surface 12a of the lower base 12.

Next, as shown in FIG. 13(B), the extension portion 20 is formed over the entire surface of the lower base 12 in contact with the surfaces of the semiconductor chip 30, which is adhered to and held on the lower base 12, other than the first main surface 36, or in other words in contact with the side surfaces 37 and second main surface 38, thereby surrounding the semiconductor chip 30, and also in contact with the surfaces of the passive element 50 other than the surfaces on which the connection terminals 52 are provided to thereby surround the passive element 50. In short, the extension portion 20 is formed covering the entire surface of the lower base 12 on which the semiconductor chip 30 and passive element 50 are provided.

Alternatively, the extension portion 20 may be formed such that the second main surface 38 of the semiconductor chip 30 is exposed.

Since the extension portion 20 does not intrude between the semiconductor chip 30 and lower base 12 or between the passive element 50 and lower base 12, the connection terminals 52 of the passive element 50, that is the first and second connection terminals 52a, 52b are not covered by the extension portion 20.

Next, the lower base 12 is removed from the first surface 20a of the extension portion 20 and the first main surface 36 by being peeled away therefrom. At this time, as described above, the adhesion means not shown in the drawing remain on the lower base 12 and are not transferred to the semiconductor chip 30 and extension portion 20. The semiconductor device 10 is then turned over so that the first surface 20a of the extension portion 20 and the first main surface 36 form an upper surface. At this time, the electrode pads 34 on the first main surface 36 and the connection terminals 52 of the passive element 50 are exposed.

Then, as shown in FIG. 15, the insulating film 40 is formed on the first main surface 36 and the first surface 20a of the extension portion 20. Here, the insulating film 40 is formed such that a part of the electrode pads 34 on the semiconductor chip 30 and a part of the connection terminals 52 of the passive element 50 are exposed.

If, for example, a height difference occurs between the surface of the extension portion 20 and the surface of the semiconductor chip 30 and/or the surface of the passive element 50, or an undulation or depression occurs on the surface of the extension portion 20, or similar, the material for forming the insulating film 40 may be used such that the height difference, undulation, and/or depression are reduced to a degree at which the respective surfaces are substantially equal to each other and at which wiring patterns may be formed.

Next, as shown in FIGS. 14 and 15, the wiring patterns 42 are formed on the surface of the insulating film 40. Formation of these wiring patterns 42 is performed in consideration of the subsequent disposal of external terminals following setting such that the respective wiring patterns 42 are electrically connected to corresponding electrode pads 34 on the surface of the insulating film 40.

More specifically, the wire width, wire spacing, optimum angles, and so on are determined in accordance with applicable wiring process rules such that connections can be made at the shortest possible distances. Regarding these wiring patterns 42 for connecting the electrode pads 34 and external terminals, as shown in the drawings for example, a plurality of wiring pattern groups, each comprising the long wire 42a, medium wire 42b, and short wire 42c, is formed in respect of the plurality of electrode pads 34 formed around the peripheral edge of the semiconductor chip 30 at the shortest possible distances.

One end portion of the wiring patterns 42 is connected to the corresponding electrode pad 34. The wiring patterns 42 are formed comprising patterns which are extended from the electrode pads 34 to the extended region 21 side.

An electrode post carrying pad is formed on the other end portion of the wiring patterns 42, and the external terminals (solder balls 47a) are connected via electrode posts.

Also in the semiconductor device 10 of the second embodiment, in addition to the wiring patterns 42, wiring patterns 42d for the passive element 50 are formed for electrically connecting the connection terminals 52 of the passive element 50 to the electrode pads 34 and/or the subsequently formed external terminals.

In the constitutional example shown in the drawings, the wiring patterns 42d for the passive element 50 are formed between the regular wiring patterns such that the first and second connection terminals 52a and 52b of the passive element 50 are connected to two different electrode pads 34.

Formation of the wiring patterns 42 may be performed by a wiring pattern forming process in a well-known WCSP manufacturing process such as sputtering or photolithography in a region of the surface region of the insulating film 40 which corresponds to the upper side of (directly above) the extension portion 20, or in other words a desired region on the insulating film 40 including the extended region 21.

Figure 16A:
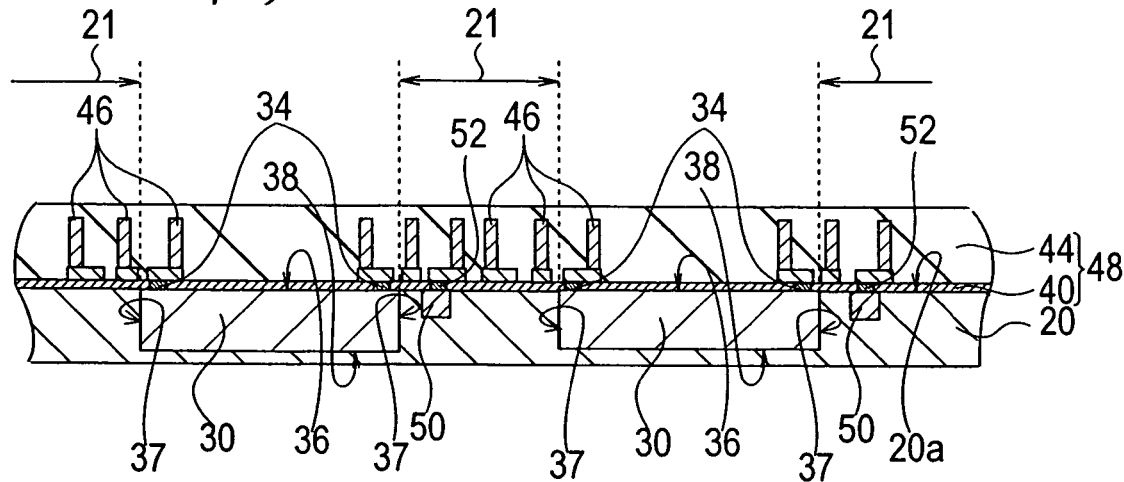
FIGS. 16(A), 16(B), and 16(C) are schematic sectional views (3) for illustrating the manufacturing method for the semiconductor device according to the second embodiment of this invention.

Next, as shown in FIG. 16(A), electrode posts are formed on the surface of each wiring pattern 42 so as to be electrically connected thereto.

The electrode posts 46 are provided in a surface region of the extended region 21 on the upper side of (directly above) the extension portion 20 and in the region near the extended region 21 on the upper side of (directly above) the semiconductor chip 30. The electrode posts 46 are formed in a lattice formation and arranged at a predetermined pitch, for example. As described above, this pitch may be set in consideration of mounting, or in other words as either a constant or irregular pitch.

After an appropriate material has been selected, the electrode posts 46 may be formed by means of an electrode post 46 forming process in a well-known WCSP manufacturing process such as plating or photolithography.

Then, as shown in FIG. 16(A), the sealing portion 44 is formed so as to cover the surface of the insulating film 40 on which the wiring patterns 42 and electrode posts 46 are formed.

This sealing step may be implemented using a well-known sealing material and a well-known method.

Figure 16B:
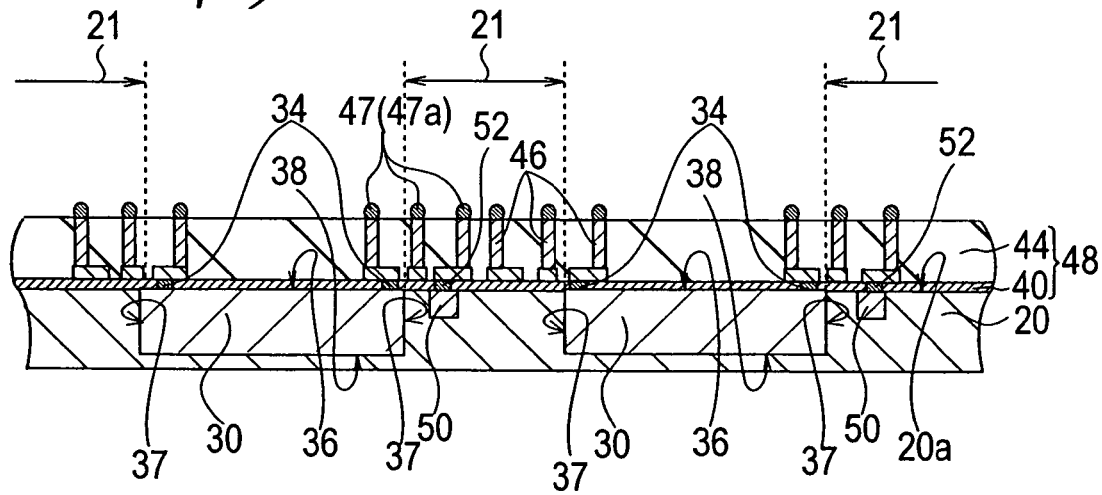

Next, as shown in FIG. 16(B), the surface side of the sealing portion 44 is trimmed such that the top surface (also referred to as the upper surface) of the electrode posts 46 is exposed.

This process may be performed using a well-known grinding or polishing process.

A method such as film formation may also be applied to the formation of the sealing portion 44. In this case, substantially no load is placed on the electrode posts 46. Also in this case, the sealing portion 44 can be formed such that the top surface of the electrode posts 46 is directly exposed on the surface of the sealing portion 44 without the need for a grinding process on the sealing portion 44 as described above.

Next, the solder balls 47a, for example, serving as the external terminals 47 are formed via the electrode posts 46 exposed through the surface of the sealing portion 44 on the upper surface thereof.

Figure 16C:
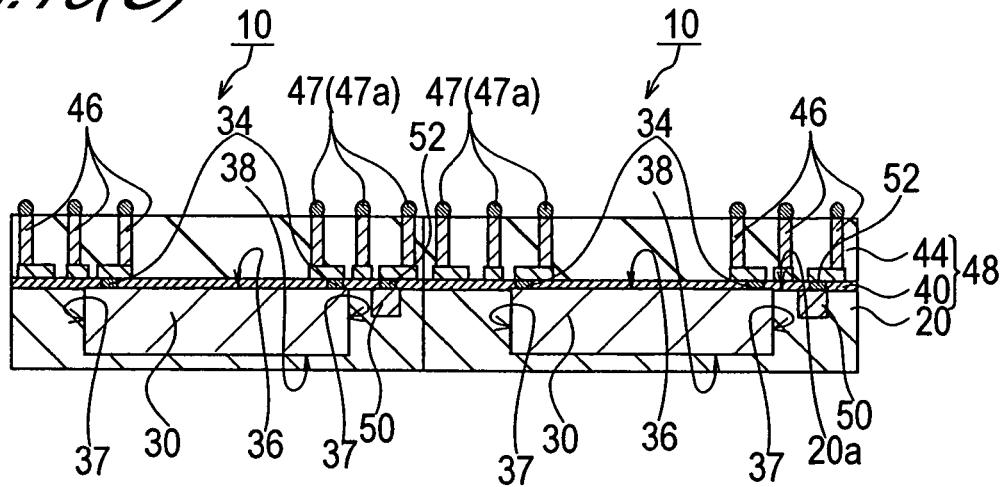

Next, as shown in FIG. 16(C), adjacent semiconductor chips are severed to provide individual semiconductor devices comprising a semiconductor chip.

This singularization process is preferably performed by cutting using a blade which rotates at high speed.

Since a WCSP manufacturing process can be applied to the manufacturing method of the second embodiment, the semiconductor device 10 can be manufactured without the need for any special processes.

The wiring patterns 42 of the semiconductor device 10 of this invention are formed straddling the boundary between the extension portion 20 region and the semiconductor chip 30 region, and hence the portion 42X of the wiring patterns 42 in the vicinity of the boundary between different constitutional elements is preferably made of thicker and/or wider wire for a certain length. In other words, portions of the wiring patterns on a boundary and vicinity thereof between semiconductor chip and the extension portion are formed wider or more thickly than other portions of said wiring patterns.

By forming the portion 42X of the wiring patterns 42 at which stress concentration is considered more likely due in particular to an edge effect, thermal stress, and soon more thickly in this manner, the operational reliability of the semiconductor device 10 is improved.

In all embodiments of this invention, the electrode posts 46 are preferably formed from a conductive material. A barrier metal layer such as a thin oxidation layer or Ni (nickel) film is preferably formed on the surface of the electrode posts 46 at this time. In so doing, the adhesive property between the electrode posts 46 and the sealing portion 44 is improved, thereby improving resistance to moisture.

Further, in all embodiments of this invention the solder balls 47a are formed on the electrode posts 46 as the external terminals 47. A so-called BGA (Ball Grid Array) has been described, but this invention is not limited thereto. For example, a so-called LGA (Land Grid Array) or the like may be formed by applying and reflow soldering solder paste onto the exposed electrode posts 46 or by implementing Ni/Au processing by means of electroless plating.

Further, in all embodiments of this invention the sealing portion may be formed not only in a so-called saw-cut form, but may also be formed not matching the profile of the extension portion as long as the extent of this mismatch is within a range which does not impair the object of this invention.

A plurality of the semiconductor devices 10 of this invention may be stacked, for example. In this case, through holes maybe formed in the extension portion 20 using a well-known method, for example, to thereby form stacking terminals.

What is claimed is:

1. A semiconductor device comprising:
   a semiconductor chip having a first main surface on which a plurality of electrode pads are provided, a second main surface which opposes said first main surface, and a plurality of side surfaces positioned between said first main surface and said second main surface;
   an extension portion formed in contact with said side surfaces of said semiconductor chip so as to surround said semiconductor chip;
   an insulating film formed on a surface of said extension portion and said first main surface such that a part of each of said electrode pads is exposed;
   a plurality of wiring patterns formed on said insulating film so as to be electrically and directly connected to said electrode pads, respectively and extended from said electrode pads to the surface of said insulating film on said extension portion and said first main surface;

a plurality of electrode posts formed on said wiring patterns so as to be electrically and directly connected therewith;

a sealing portion formed on said wiring patterns and said insulating film such that the top surface of said electrode posts is exposed; and a plurality of external terminals provided on the top surface of said electrode posts in a region including the upper side of said extension portion;

wherein the electrode pads are arranged in a first line extending in a first direction along a peripheral edge of the semiconductor chip on the first main surface, and the external terminals are arranged in a second line extending in a second direction perpendicular to said first direction, and are electrically connected to the electrode pads in a one-on-one connection relationship.

2. The semiconductor device according to claim 1, wherein said electrode posts are formed from a conductive material.

3. The semiconductor device according to claim 2, wherein a thin oxidation layer is formed on a side surface of said electrode posts.

4. The semiconductor device according to claim 1, wherein said external terminals are formed as solder balls.

5. The semiconductor device according to claim 1, wherein said external terminals are lands.

6. The semiconductor device according to claim 1, wherein a portion of said wiring patterns on a boundary and a vicinity of a boundary between a region on the upper side of said semiconductor chip and said extension portion is formed wider or more thickly than other portions of said wiring patterns.

7. The semiconductor device according to claim 1, wherein said extension portion is formed from a material having a greater molding shrinkage than the molding shrinkage of said sealing portion.

8. The semiconductor device according to claim 7, wherein said extension portion is formed from a liquid resin having a linear expansion coefficient in a lower temperature range than glass transition temperature of less than $1.5 \times 10^{-5}/°$ C. and a modulus of elasticity within a range of 7.8 to 22 GPa.

9. The semiconductor device according to claim 1, comprising:

a passive element comprising connection terminals and provided on said extension portion; wherein the insulating is film formed such that a part of said connection terminals is exposed.

10. The semiconductor device according to claim 9, wherein a portion of said wiring patterns on a boundary and a vicinity thereof between a region on the upper side of said semiconductor chip and said extension portion is formed wider or more thickly than other portions of said wiring patterns.

11. The semiconductor device according to claim 9, wherein said passive element provided on said extension portion comprises a plurality of connection terminals, one of said connection terminals being connected to said electrode pads and the other connection terminal being connected to said external terminals.

12. The semiconductor device according to claim 9, wherein said passive element provided on said extension portion comprises a plurality of connection terminals, one of said connection terminals being connected to a specific external terminal and the other connection terminal being connected to a different external terminal.

13. The semiconductor device according to claim 9, further comprising a plurality of electrode posts formed between said wiring patterns and said external terminals, wherein said sealing portion is formed such that the top surface of said electrode posts is exposed.

14. The semiconductor device according to claim 9, wherein said electrode posts are formed from a conductive material.

15. The semiconductor device according to claim 9, wherein a thin oxidation layer is formed on a side surface of said electrode posts.

16. The semiconductor device according to claim 9, wherein said external terminals are solder balls.

17. The semiconductor device according to claim 9, wherein said external terminals are lands.

18. The semiconductor device according to claim 9, wherein said extension portion is formed from a material having a greater molding shrinkage than the molding shrinkage of said sealing portion.

19. The semiconductor device according to claim 18, wherein said extension portion is formed from a liquid resin having a linear expansion coefficient in a lower temperature range than glass transition temperature of less than $1.5 \times 10^{-5}/°$ C. and a modulus of elasticity within a range of 7.8 to 22 GPa.

* * * * *